US008723237B2

(12) United States Patent
Torii

(10) Patent No.: US 8,723,237 B2
(45) Date of Patent: May 13, 2014

(54) METHOD FOR DESIGNING A SEMICONDUCTOR DEVICE INCLUDING STRESS FILMS

(71) Applicant: Fujitsu Semiconductor Limited, Yokohama (JP)

(72) Inventor: Yasunobu Torii, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 13/734,125

(22) Filed: Jan. 4, 2013

(65) Prior Publication Data

US 2013/0119475 A1    May 16, 2013

Related U.S. Application Data

(62) Division of application No. 12/938,483, filed on Nov. 3, 2010.

(30) Foreign Application Priority Data

Nov. 4, 2009  (JP) ................................. 2009-253381

(51) Int. Cl.
*H01L 21/8238* (2006.01)
*H01L 29/78* (2006.01)

(52) U.S. Cl.
CPC .... *H01L 29/7843* (2013.01); *H01L 21/823807* (2013.01); *H01L 21/82385* (2013.01)
USPC ................... 257/288; 257/371; 257/E21.633; 257/E27.067; 438/151; 438/199

(58) Field of Classification Search
CPC ................. H01L 21/823807; H01L 21/82385; H01L 29/7843
USPC ................... 257/288, 371, E21.633, E27.067; 438/151, 196, 199
See application file for complete search history.

(56) References Cited

U.S. PATENT DOCUMENTS 7,105,394 B2    9/2006  Hachimine et al.
7,420,202 B2    9/2008  Adams et al.
(Continued)

FOREIGN PATENT DOCUMENTS

JP    09-222720     8/1997
JP    2003-273240 A  9/2003
(Continued)

OTHER PUBLICATIONS

Grudowski, Paul et al.,"1-D and 2-D Geometry Effects in Uniaxially-Strained Dual Etch Stop Layer Stressor Integrations",2006 Symposium on VLSI Technology Digest of Technical Papers, p. 76-77 Jun. 13, 2006.

(Continued)

*Primary Examiner* — John C Ingham
(74) *Attorney, Agent, or Firm* — Fujitsu Patent Center

(57) ABSTRACT

A method for designing a semiconductor device includes arranging at least a pattern of a first active region in which a first transistor is formed and a pattern of a second active region in which a second transistor is formed; arranging at least a pattern of a gate wire which intersects the first active region and the second active region; extracting at least a first region in which the first active region and the gate wire are overlapped with each other; arranging at least one pattern of a compressive stress film on a region including the first active region; and obtaining by a computer a layout pattern of the semiconductor device, when the at least one pattern of the compressive stress film is arranged, end portions of the at least one pattern thereof are positioned based on positions of end portions of the first region.

6 Claims, 29 Drawing Sheets

(56) References Cited

U.S. PATENT DOCUMENTS

| | | |
|---|---|---|
| 7,761,838 B2 | 7/2010 | Shi et al. |
| 2007/0202652 A1* | 8/2007 | Moroz et al. .................. 438/296 |
| 2007/0221962 A1 | 9/2007 | Ishizu |
| 2008/0054366 A1 | 3/2008 | Pidin |
| 2008/0169484 A1* | 7/2008 | Chuang et al. ................ 257/190 |
| 2009/0230439 A1* | 9/2009 | Wang et al. ................... 257/288 |

FOREIGN PATENT DOCUMENTS

| | | |
|---|---|---|
| JP | 2007-258330 A | 10/2007 |
| JP | 2008-66484 A | 3/2008 |
| JP | 2008-160037 A | 7/2008 |
| JP | 2009-515360 | 4/2009 |

OTHER PUBLICATIONS

USPTO, [INGHAM] "U.S. Appl. No. 12/475,982 (parent)," [CTRS] Requirement for Restriction/Election issued on Nov. 28, 2012.
USPTO [INGHAM] "U.S. Appl. No. 12/938,483 (related)," [CTNF] Non-Final Rejection issued on Mar. 26, 2013 (pending).
USPTO, [INGHAM] "U.S. Appl. No. 12/938,483 (related)," [CTNF] Non-Final Rejection issued on Nov. 7, 2013 (pending).
USPTO, [INGHAM], Final Rejection, Aug. 27, 2013, in related U.S. Appl. No. 12/938,483 [pending].
Japanese Office Action mailed Oct. 22, 2013 for corresponding Japanese Application No. 2009-253381, with English-language translation.

\* cited by examiner

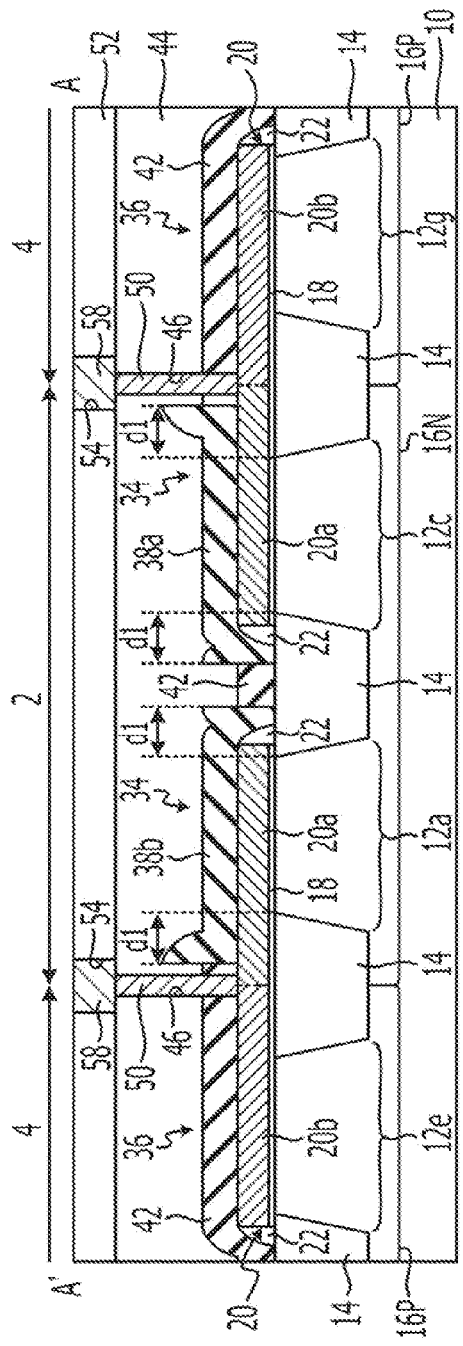
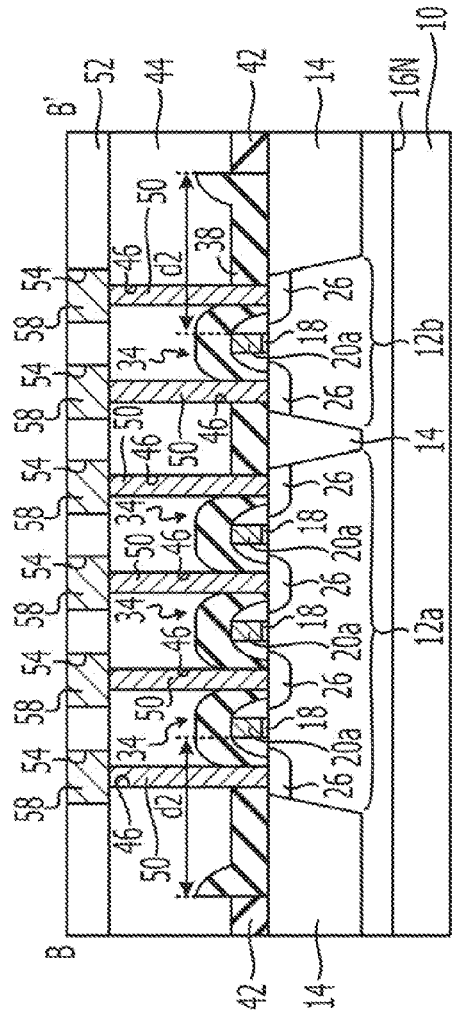
FIG. 3A
FIG. 3B

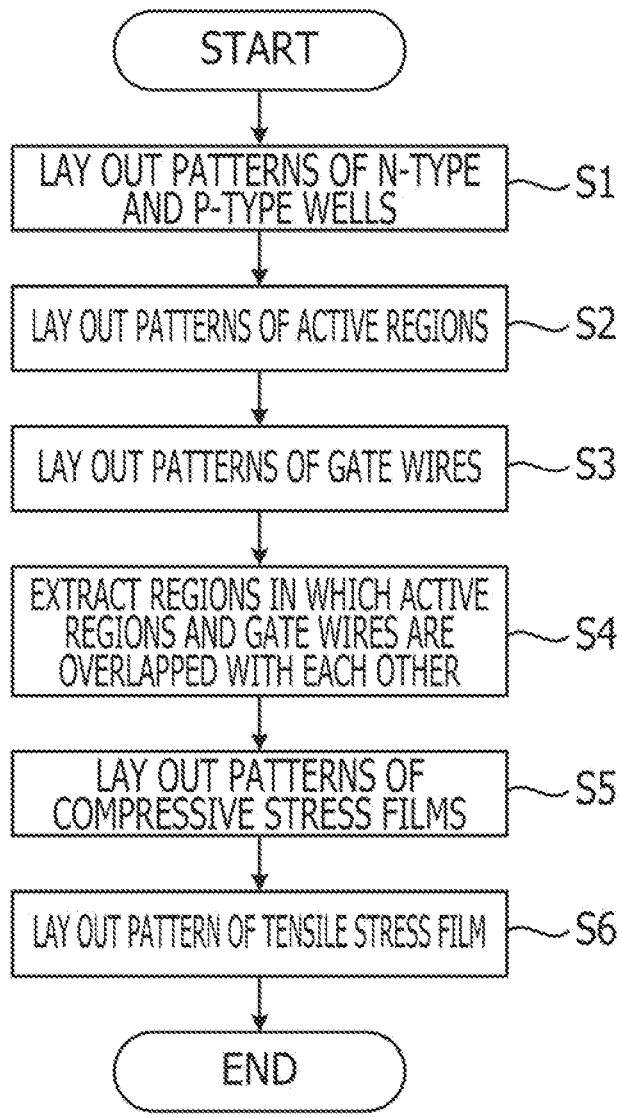

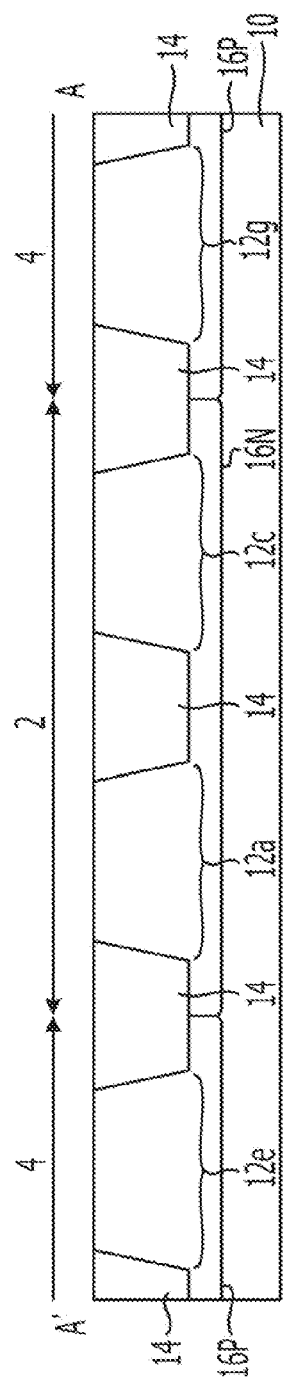
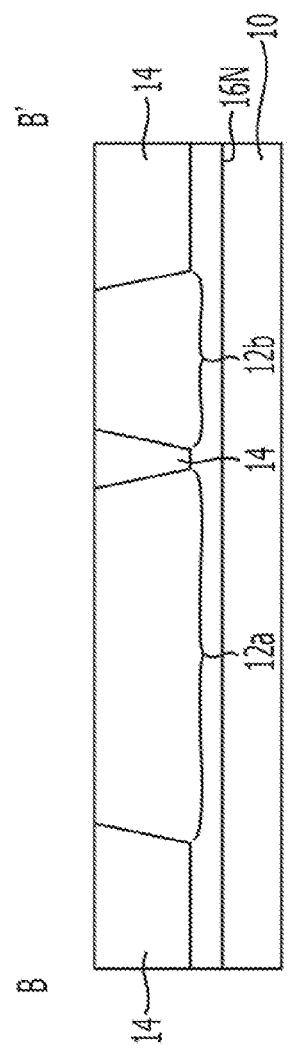
FIG. 10A
FIG. 10B

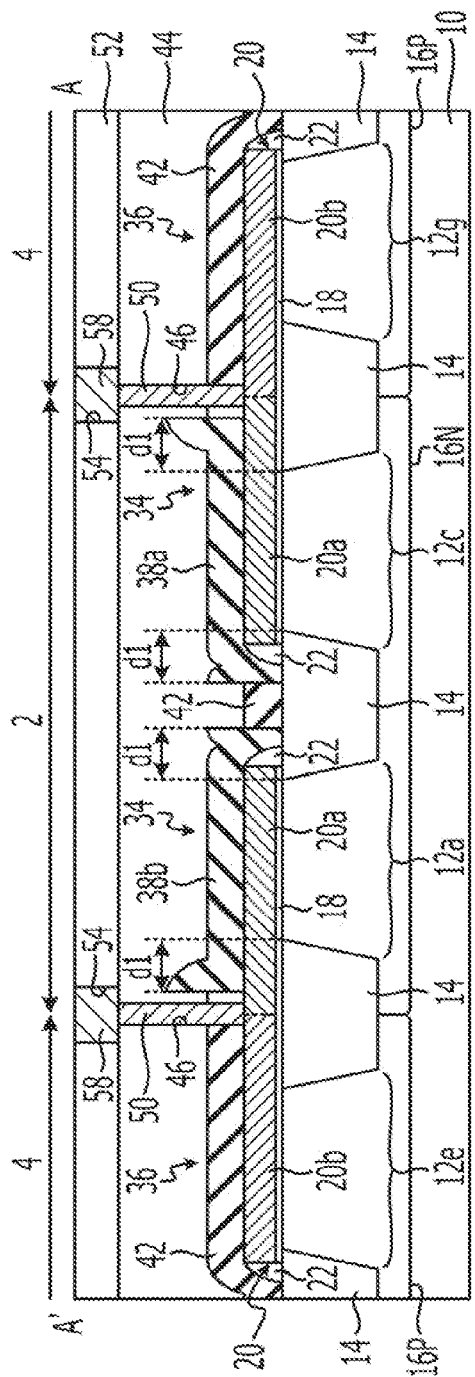
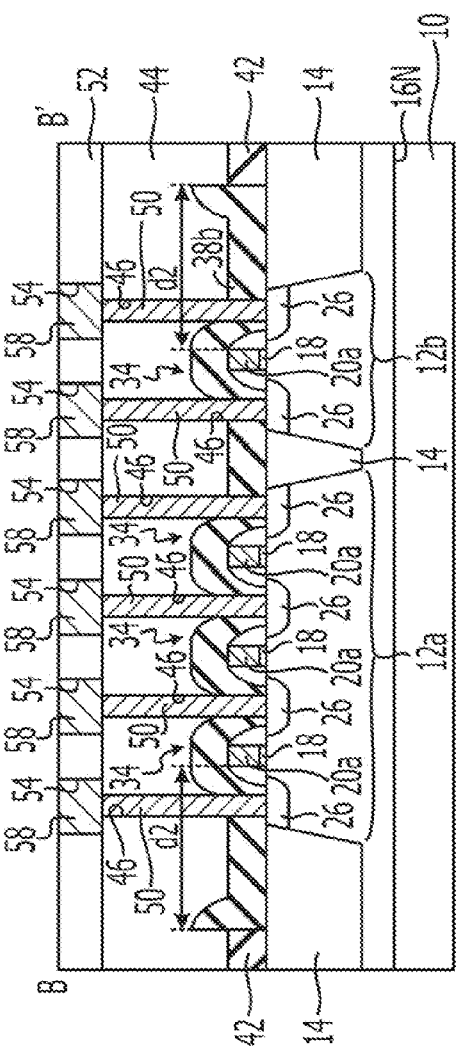
FIG. 17A
FIG. 17B

METHOD FOR DESIGNING A SEMICONDUCTOR DEVICE INCLUDING STRESS FILMS

CROSS-REFERENCE TO RELATED APPLICATIONS

This application is a divisional of application Ser. No. 12/938,483, filed Nov. 3, 2010, which claims the benefit of priority of the prior Japanese Patent Application No. 2009-253381, filed on Nov. 4, 2009 the entire contents of which are incorporated herein by reference.

FIELD

The embodiments described herein relate to a semiconductor device, a method for designing a semiconductor device, and a method for manufacturing a semiconductor device.

BACKGROUND

Heretofore, a semiconductor device which includes a CMOS circuit having a PMOS transistor and an NMOS transistor has been known.

In recent years, in order to improve the carrier mobility of a PMOS transistor, a technique has been proposed in which a compressive stress film is formed to cover the PMOS transistor so as to apply a compressive stress to the channel region thereof.

In addition, in order to improve the carrier mobility of an NMOS transistor, a technique has also been proposed in which a tensile stress film is formed to cover the NMOS transistor so as to apply a tensile stress to the channel region thereof.

However, when a compressive stress film and/or a tensile stress film is simply formed, there has been a problem in that electrical properties of the transistor are not always sufficiently improved.

SUMMARY

According to one aspect of the invention, a method for designing a semiconductor device includes arranging at least a pattern of a first active region in which a first transistor is formed and a pattern of a second active region in which a second transistor is formed; arranging at least a pattern of a gate wire which intersects the first active region and the second active region; extracting at least a first region in which the first active region and the gate wire are overlapped with each other; arranging at least one pattern of a compressive stress film on a region including the first active region; arranging a pattern of a tensile stress film adjacent to the compressive stress film on a region including the second active region; and obtaining by a computer a layout pattern of the semiconductor device, when the at least one pattern of the compressive stress film is arranged, end portions of the at least one pattern thereof are positioned based on positions of end portions of the first region.

The object and advantages of the invention will be realized and attained by at least the features, elements, and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 3A and 3B are cross-sectional views illustrating the semiconductor device according to the first embodiment;

FIG. 4 is a flowchart illustrating a method for designing a semiconductor device according to the first embodiment;

FIGS. 10A and 10B are cross-sectional views (part 1) illustrating a method for manufacturing a semiconductor device according to the first embodiment;

FIGS. 17A and 17B are cross-sectional views (part 8) illustrating the method for manufacturing a semiconductor device according to the first embodiment;

DETAILED DESCRIPTION OF THE EMBODIMENTS

In the figures, dimensions and/or proportions may be exaggerated for clarity of illustration. It will also be understood that when an element is referred to as being "connected to" another element, it may be directly connected or indirectly connected, i.e., intervening elements may also be present. Further, it will be understood that when an element is referred to as being "between" two elements, it may be the only element between the two elements, or one or more intervening elements may also be present.

When a compressive stress film is formed so as to cover a PMOS transistor, a compressive stress is applied to the channel region of the PMOS transistor, and the carrier mobility thereof is improved, so that the ON-current of the PMOS transistor may be improved.

In addition, when a tensile stress film is formed so as to cover an NMOS transistor, a tensile stress is applied to the channel region of the NMOS transistor, and the carrier mobility thereof is improved, so that the ON-current of the NMOS transistor may be improved.

A pattern of the compressive stress film is laid out, for example, to coincide with a pattern of an N-type well in a region in which the PMOS transistor is formed. A pattern of the tensile stress film is laid out, for example, to coincide with a pattern of a P-type well in a region in which the NMOS transistor is formed.

However, when the compressive stress film and/or the tensile stress film is laid out so as to coincide with the pattern of the N-type well and/or that of the P-type well, even between PMOS transistors having substantially the same channel width and/or substantially the same channel length, the ON-currents thereof may vary from each other in some cases.

Figure 29:
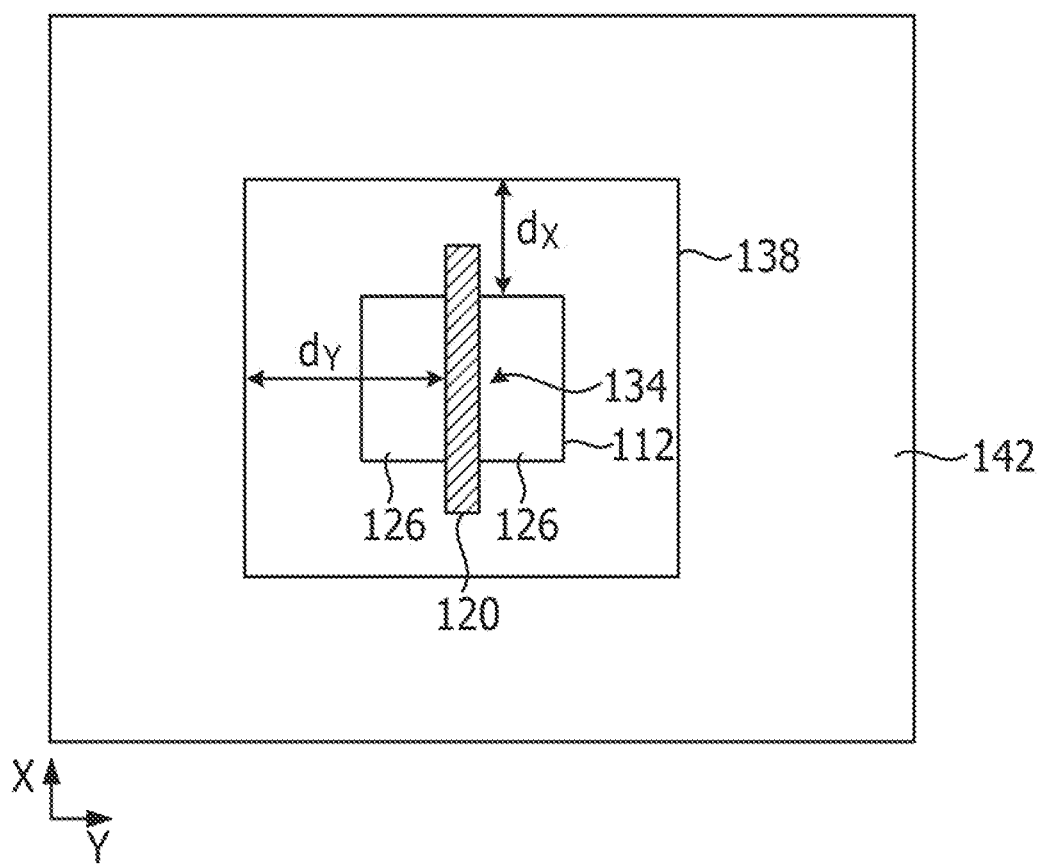
FIG. 29 is a plan view illustrating a PMOS transistor covered with a compressive stress film.

FIG. 29 is a plan view illustrating a PMOS transistor covered with a compressive stress film.

As illustrated in FIG. 29, a gate wire (gate electrode) 120 is formed so as to intersect an active region 112. Source/drain diffusion layers 126 are formed in a semiconductor substrate at two sides of the gate electrode 120. Accordingly, a PMOS transistor 134 having the gate electrode 120, and the source/drain diffusion layers 126 is formed.

On the semiconductor substrate, a compressive stress film 138 is formed so as to cover the PMOS transistor 134.

A tensile stress film 142 is formed in a region other than the region in which the compressive stress film 138 is formed.

When a distance dX in a longitudinal direction (X direction) of the gate wire 120 from an end portion of a channel to the boundary between the compressive stress film 138 and the tensile stress film 142 is decreased, the ON-current of the PMOS transistor 134 tends to increase.

That is, the ON-current of the PMOS transistor 134 is dependent on the distance dX. In order to increase the ON-current, the distance dX in the longitudinal direction (X direction) of the gate wire 120 from the end portion of the channel to the boundary between the compressive stress film 138 and the tensile stress film 142 is decreased. However, if the distance dX in the longitudinal direction of the gate wire 120 from the end portion of the channel to the boundary between the compressive stress film 138 and the tensile stress film 142 is different between PMOS transistors, the ON-currents thereof may vary from each other.

Through intensive research carried out by the inventor of the present application, it was found that when the distances dX of individual PMOS transistors are controlled substantially equal to each other, the variation in ON-current therebetween may be substantially suppressed.

When a distance dY from an end portion of the channel to the boundary between the compressive stress film 138 and the tensile stress film 142 in a direction perpendicular to the longitudinal direction of the gate wire 120 is excessively decreased, the ON-current of the PMOS transistor 134 tends to decrease. However, since the distance dY is designed sufficiently larger than the distance dX, even if the distances dY of PMOS transistors vary to a certain extent, the ON-currents thereof may not vary considerably, and hence no particular problems occur.

[First Embodiment]
(Semiconductor Device)

Figure 1:
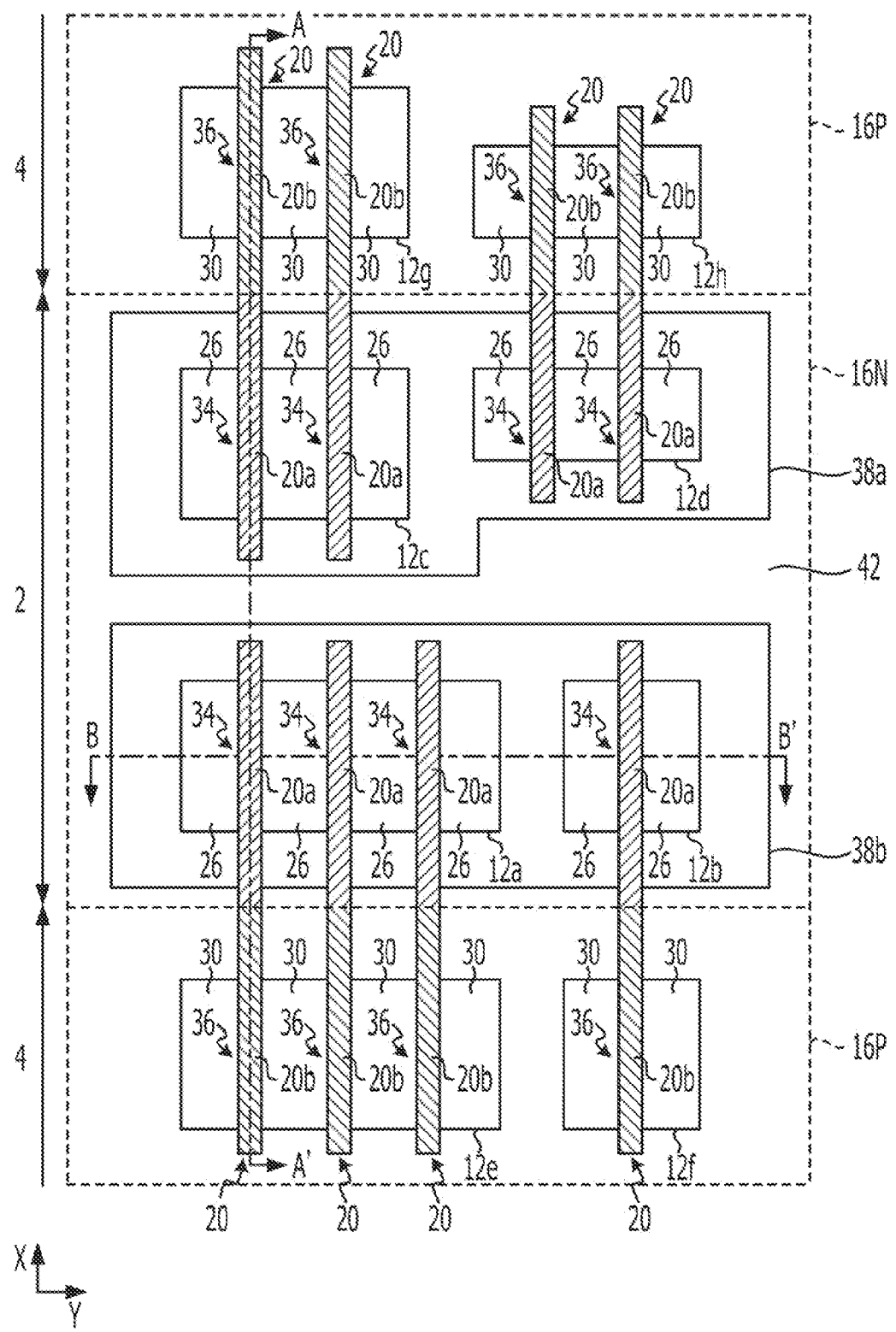
FIG. 1 is a plan view (part 1) illustrating a semiconductor device according to a first embodiment.
Figure 2:
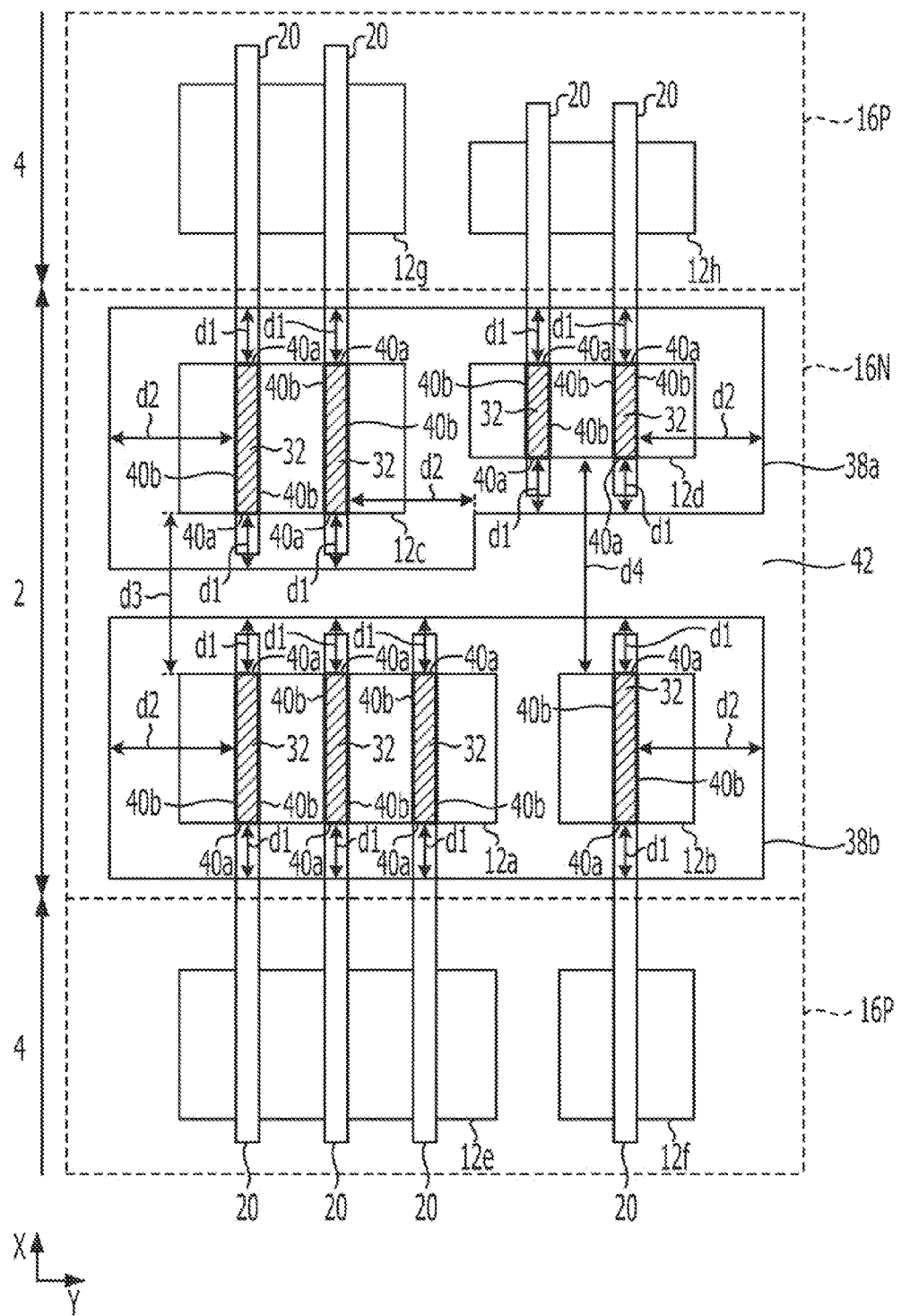
FIG. 2 is a plan view (part 2) illustrating the semiconductor device according to the first embodiment.

First, the semiconductor device according to an embodiment will be described with reference to FIG. 1 to FIGS. 17A and 17B. FIG. 1 is a plan view (part 1) illustrating the semiconductor device according to this embodiment. FIG. 2 is a plan view (part 2) illustrating the semiconductor device according to this embodiment. FIGS. 3A and 3B are cross-sectional views illustrating the semiconductor device according to this embodiment. FIG. 3A is a cross-sectional view taken along the line A-A' of FIG. 1. FIG. 3B is a cross-sectional view taken along the line B-B' of FIG. 1.

An element isolation region 14 defining active regions (element regions) 12a-12h is formed in a semiconductor substrate 10. As the semiconductor substrate 10, for example, a P-type silicon substrate is used. In a PMOS transistor formation region 2, the active regions 12a to 12d defined by the element isolation region 14 are formed. In NMOS transistor formation regions 4, the active regions 12e-12h defined by the element isolation region 14 are formed.

An N-type well 16N is formed in the semiconductor substrate 10 in the PMOS transistor formation region 2. P-type wells 16P are formed in the semiconductor substrate 10 in the NMOS transistor formation regions 4.

On the PMOS transistor formation region 2, gate electrodes 20a are formed with gate insulating films 18 provided therebetween. On the NMOS transistor formation regions 4, gate electrodes 20b are formed with gate insulating films 18 provided therebetween.

The gate electrode 20a and the gate electrodes 20b are parts of a gate wire 20 which is continuously formed in the PMOS transistor formation region 2 and the NMOS transistor formation region 4. As the gate wire 20, for example, a polysilicon film is used.

A P-type dopant is introduced into the gate wire 20 in the PMOS transistor formation region 2, and hence the gate electrode 20a of a PMOS transistor 34 is formed. An N-type dopant is introduced into the gate wire 20 in the NMOS transistor formation region 4, and hence the gate electrode 20b of an NMOS transistor 36 is formed.

Sidewall insulating films 22 are formed on sidewall portions of the gate wire 20, that is, on sidewall portions of the gate electrode 20a of the PMOS transistor 34 and sidewall portions of the gate electrode 20b of the NMOS transistor 36.

In the semiconductor substrate 10 at two sides of the gate electrode 20a provided with the sidewall insulating films 22, source/drain diffusion layers 26 are formed. In the semiconductor substrate 10 at two sides of the gate electrode 20b provided with the sidewall insulating films 22, source/drain diffusion layers 30 are formed.

On an upper portion of the gate wire 20 and on the source/drain diffusion layers 26 and 30, silicide layers (not illustrated) are formed. As the silicide layer, for example, a nickel silicide layer or a cobalt silicide layer is used.

Accordingly, in the active region 12a to 12d in the PMOS transistor formation region 2, the PMOS transistors 34 each having the gate electrode 20a and the source/drain diffusion layers 26 are formed. In addition, in the active region 12e to 12h in the NMOS transistor formation regions 4, the NMOS transistors 36 each having the gate electrode 20b and the source/drain diffusion layers 30 are formed.

On the semiconductor substrate 10 in the PMOS transistor formation region 2, stress films (compressive stress films) 38a and 38b are formed so as to cover the PMOS transistors 34. The compressive stress films 38a and 38b are films functioning to apply a compressive stress to the channel region of each PMOS transistors 34 so as to improve the carrier mobility thereof. The compressive stress films 38a and 38b are formed on a region including the active regions 12a to 12d in which the PMOS transistors 34 are formed. As the compressive stress films 38a and 38b, for example, a silicon nitride film is used. The thickness of each of the compressive stress films 38a and 38b is set, for example, to approximately 30 to 90 nm.

On the semiconductor substrate 10 in the NMOS transistor formation regions 4, a stress film (tensile stress film) 42 is formed so as to cover the NMOS transistors 36. The tensile stress film 42 is a film functioning to apply a tensile stress to the channel region of each NMOS transistors 36 so as to improve the carrier mobility thereof. The tensile stress film 42 is formed on a region including the active regions 12e to 12h in which the NMOS transistors 36 are formed. As the tensile stress film 42, for example, a silicon nitride film is used. The thickness of the tensile stress film 42 is set, for example, to approximately 30 to 90 nm.

The tensile stress film 42 is formed in a region other than the regions in which the compressive stress films 38a and 38b are formed. Outer ends of the compressive stress films 38a and 38b and inner ends of the tensile stress film 42 come into contact with each other at the boundaries between the compressive stress films 38a and 38b and the tensile stress film 42. Hence, the positions of the outer ends of the compressive stress films 38a and 38b coincide with the positions of the inner ends of the tensile stress film 42.

In addition, inner end portions of the tensile stress film 42 may be located on outer end portions of the compressive stress films 38a and 38b. In this case, the positions at which the outer ends of the compressive stress films 38a and 38b and the tensile stress film 42 come into contact with each other are the boundaries between the compressive stress films 38a and 38b and the tensile stress film 42.

The outer end portions of the compressive stress films 38a and 38b may be located on the inner end portions of the tensile stress film 42. In this case, the positions at which the compressive stress films 38a and 38b and the inner ends of the tensile stress film 42 come into contact with each other are the boundaries between the compressive stress films 38a and 38b and the tensile stress film 42.

Patterns of the compressive stress films 38a and 38b are obtained based on patterns which are formed so that, first, regions 32 in which the gate wires 20 and the active regions 12a to 12d are overlapped with each other are each extended by a first value d1 in an X direction and by a second value d2 in a Y direction which is perpendicular to the X direction, and subsequently, regions which are overlapped with each other by the extensions are merged together.

Since the regions 32 are each extended by the first value d1 in a longitudinal direction of the gate wires 20, the distances from end portions 40a of the regions 32 to the outer ends of the compressive stress films 38a and 38b are all set substantially equal to each other, that is, the distances are all set to the first value d1. Since the regions 32 are extended by the first value d1 in the X direction, the distances in the X direction from the end portions of the active regions 12a to 12d to the outer ends of the compressive stress films 38a and 38b are all set to the first value d1.

In order to improve the ON-current of the PMOS transistor 34, the distances d1 in the longitudinal direction of the gate wires 20 from the end portions 40a of the regions 32 to the boundaries between the compressive stress films 38a and 38b and the tensile stress film 42 are set smaller, for example. However, the distance d1 is set, for example, in consideration of the machining accuracy, positioning accuracy of patterns, and the like which are obtained when the active regions 12a to 12d, the compressive stress films 38a and 38b, and the tensile stress film 42 are formed. In this embodiment, the distance d1 is set, for example, to approximately 0.1 to 0.3 μm.

Since the regions 32 are extended by the second value d2 in a direction (Y direction) perpendicular to the longitudinal direction of the gate wires 20, the distances in the Y direction from end portions 40b of the regions 32 to the outer ends of the compressive stress films 38a and 38b are all set to the second value d2. In order to improve the ON-current of the PMOS transistor 34, the distance d2 is set larger, for example. In this embodiment, the distance d2 is set, for example, to approximately 0.3 to 1 μm.

Since the second value d2 is relatively large, and the first value d1 is relatively small, the second value d2 is set larger than the first value d1, for example.

The tensile stress film 42 is arranged in the region other than the regions in which the compressive stress films 38a and 38b are formed. The positions of the inner ends of the tensile stress film 42 are set so as to coincide with the positions of the outer ends of the compressive stress films 38a and 38b.

Accordingly, the positions of the outer ends of the compressive stress films 38a and 38b and the positions of the inner ends of the tensile stress film 42 are set based on the positions of the end portions 40a and 40b of the regions 32 in which the active regions 12a to 12d and the gate wires 20 are overlapped with each other.

Accordingly, in this embodiment, the distances d1 in the longitudinal direction of the gate wires 20 from the end portions 40a of the regions 32 to the boundaries between the compressive stress films 38a and 38d and the tensile stress film 42 are all set substantially equal to each other. Hence, according to this embodiment, while the variation in ON-current of the PMOS transistors 34 is substantially suppressed, the ON-currents thereof may be improved.

A space d3 between the active region 12a and the active region 12c, which are adjacent to each other in the longitudinal direction (X direction) of the gate wires 20, is set two times or more of the first value d1. In addition, a space d4 between the active region 12d and the active region 12b, which are adjacent to each other in the longitudinal direction of the gate wires 20, is also set two times or more of the first value d1. On the other hand, the distances in the longitudinal direction of the gate wires 20 from the end portions 40a of the regions 32 to the boundaries between the compressive stress films 38a and 38b and the tensile stress film 42 are all set to the first value d1. Hence, the tensile stress film 42 exists between the compressive stress films 38a and 38b.

An interlayer insulation film 44 is formed on the semiconductor substrate 10 on which the compressive stress films 38a and 38b and the tensile stress film 42 are formed.

The surface of the interlayer insulation film 44 is planarized. The thickness of the interlayer insulation film 44 is set, for example, to approximately 200 to 400 nm. As the interlayer insulation film 44, for example, a silicon oxide film or a phosphosilicate glass (PSG) film is used.

Contact holes 46 reaching the gate wires 20 are formed in the interlayer insulation film 44 and the tensile stress film 42. In addition, contact holes 46 reaching the source/drain diffusion layers 26 of the PMOS transistors 34 are formed in the interlayer insulation film 44 and the compressive stress films 38a and 38b in the PMOS transistor formation region 2. Contact holes 46 reaching the source/drain diffusion layers 30 of the NMOS transistors 36 are formed in the interlayer insulation film 44 and the tensile stress film 42 in the NMOS transistor formation regions 4.

A barrier metal film (not illustrated) is formed in each contact hole 46. The barrier metal film is formed, for example, by sequentially laminating a Ti film (not illustrated) and a TiN film (not illustrated).

In each contact hole 46 in which the barrier metal film is formed, a conductor plug 50 is filled. As a material for the conductor plug 50, for example, tungsten (W) is used.

An interlayer insulation film 52 is formed on the interlayer insulation film 44 in which the conductor plugs 50 are buried. As the interlayer insulation film 52, for example, a silicon oxide film is used.

Grooves 54 in which wires 58 are filled are formed in the interlayer insulation film 52. The upper surface of each conductor plug 50 is exposed at the bottom of each groove 54.

A barrier metal film (not illustrated) is formed in each groove 54. As the barrier metal film, for example, a tantalum (Ta) film is used.

The wire 58 is filled in each groove 54 in which the barrier metal film is formed. As a material for the wire 58, for example, Cu (copper) is used.

Accordingly, a semiconductor device including a CMOS circuit which has the PMOS transistors 34 and the NMOS transistors 36 is formed.

As described above, in this embodiment, the distances d1 in the longitudinal direction of the gate wires 20 from the end portions 40a of the regions 32 to the boundaries between the compressive stress films 38a and 38b and the tensile stress film 42 are all set substantially equal to each other. Hence, according to this embodiment, while the variation in ON-current of the PMOS transistors 34 is substantially suppressed, the ON-currents thereof may be increased, and furthermore, a semiconductor device having excellent electrical properties may also be provided.

(Semiconductor Design Apparatus)

The semiconductor device according to an embodiment is designed by the method for designing a semiconductor device according to this embodiment which will be described later. The method for designing a semiconductor device according to this embodiment may be performed, for example, by using a semiconductor design apparatus (design support apparatus), such as CAD, in which a computer program for performing the design method according to this embodiment is installed.

Figure 28:
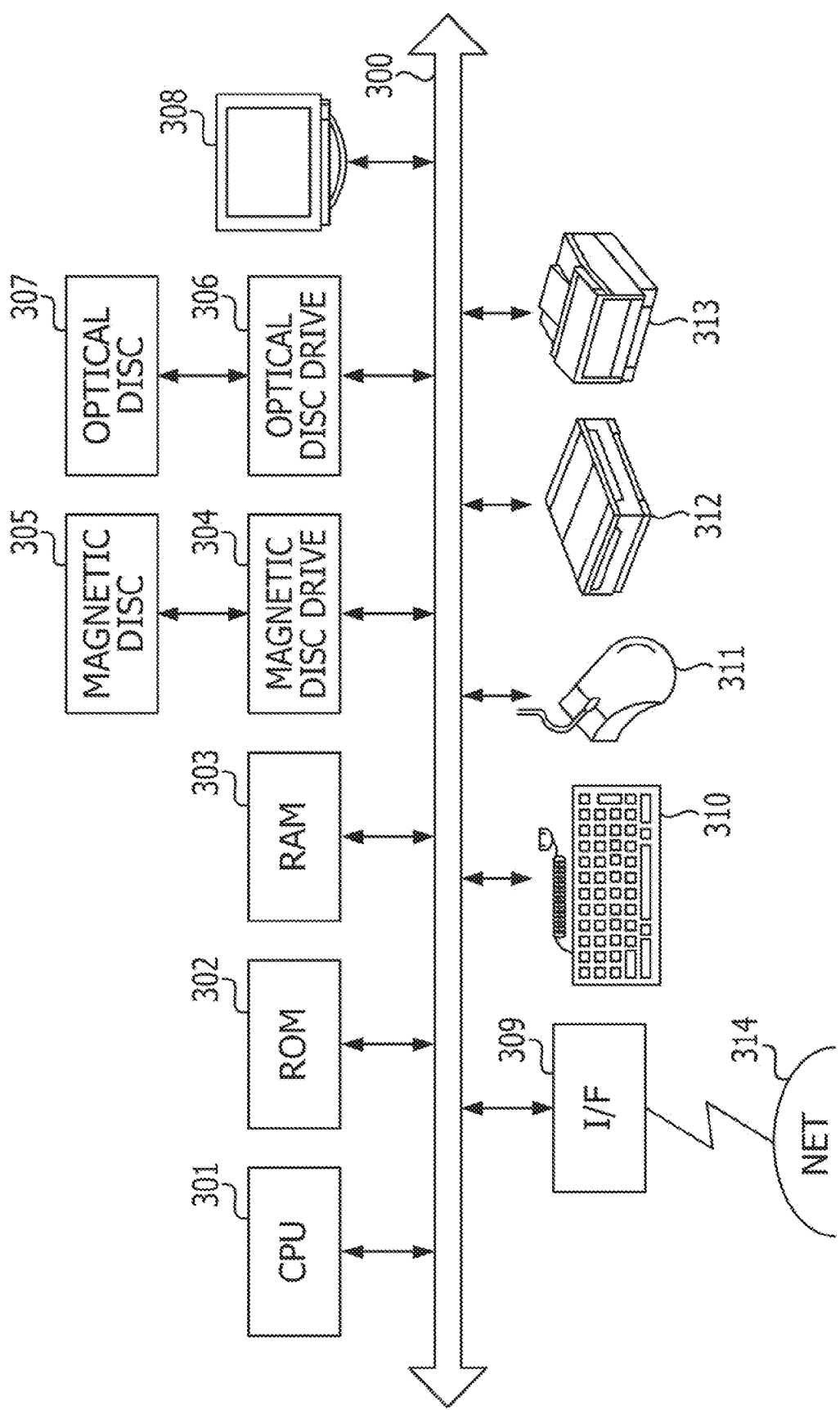
FIG. 28 is a block diagram illustrating a semiconductor designing apparatus.

The semiconductor design apparatus used in the method for designing a semiconductor device according to this embodiment will be described with reference to FIG. 28. FIG. 28 is a block diagram illustrating a semiconductor design apparatus.

As illustrated in FIG. 28, the semiconductor design apparatus includes a central processing unit (CPU) 301, a read-only memory (ROM) 302, a random access memory (RAM) 303, a magnetic disk drive 304, a magnetic disk 305, an optical disk drive 306, an optical disc 307, a display 308, an interface (I/F) 309, a keyboard 310, a mouse 311, a scanner 312, and a printer 313. In addition, the constituent elements are each connected by a bus 300.

In this semiconductor design apparatus, the CPU 301 is responsible to control the entire design support apparatus. The ROM 302 stores programs, such as a boot program. The RAM 303 is used as a work area of the CPU 301. The magnetic disk drive 304 controls read/write of data to the magnetic disk 305 in accordance with the control of the CPU 301.

The magnetic disk 305 stores the data written thereon by the control of the magnetic disk drive 304. A computer program for performing the method for designing a semiconductor device according to this embodiment is installed in the magnetic disk 305. In addition, design data of the semiconductor device are stored in the magnetic disk 305. The computer program for performing the method for designing a semiconductor device according to this embodiment obtains a layout pattern of the semiconductor device based on the design data thereof by allowing a computer (CPU) to perform specified operations which will be described later.

The optical disk drive 306 controls read/write of data to the optical disc 307 in accordance with the control of the CPU 301. The optical disc 307 stores the data written thereon by the control of the optical disk drive 306 and allows the computer to read the data stored on the optical disc 307.

The display 308 displays data of documents, images, function information, and the like besides a cursor, icons, and tool boxes. As the display 308, for example, a cathode ray tube (CRT), a thin film transistor (TFT) liquid crystal display, or a plasma display may be used.

The I/F 309 is connected to networks 314, such as a local area network (LAN), a wide area network (WAN), and the Internet, through a communication line and is further connected to other apparatuses through these networks 314. In addition, the I/F 309 functions as an interface between the inside of the semiconductor design apparatus and the networks 314 and controls the input/output of data from/to external apparatuses. For example, a modem or a LAN adapter may be used as the I/F 309.

The keyboard 310 has keys to input characters, numerals, various instructions, and the like and inputs data. In addition, the keyboard 310 may also have a touch-sensitive input pad, a numerical keypad, and the like. The mouse 311 is responsible for the movement of a cursor, range selection, movement of windows, change in size, and the like. Any device having a function similar to that of a pointing device, such as a trackball or a joystick, may also be used.

The scanner 312 optically reads an image and incorporates its data in the design support apparatus.

The scanner 312 may also have an optical character reader (OCR) function. In addition, the printer 313 prints image data and document data. For example, a laser beam printer or an ink jet printer may be used as the printer 313.

(Method for Designing Semiconductor Device)

Next, the method for designing a semiconductor device according to this embodiment will be described with reference to FIGS. 4 to 9. FIG. 4 is a flowchart illustrating the method for designing a semiconductor device according to this embodiment. FIGS. 5 to 9 are plan views each illustrating the method for designing a semiconductor device according to this embodiment.

The method for designing a semiconductor device according to this embodiment may be performed, for example, by using a semiconductor design apparatus as illustrated in FIG. 28.

Figure 5:
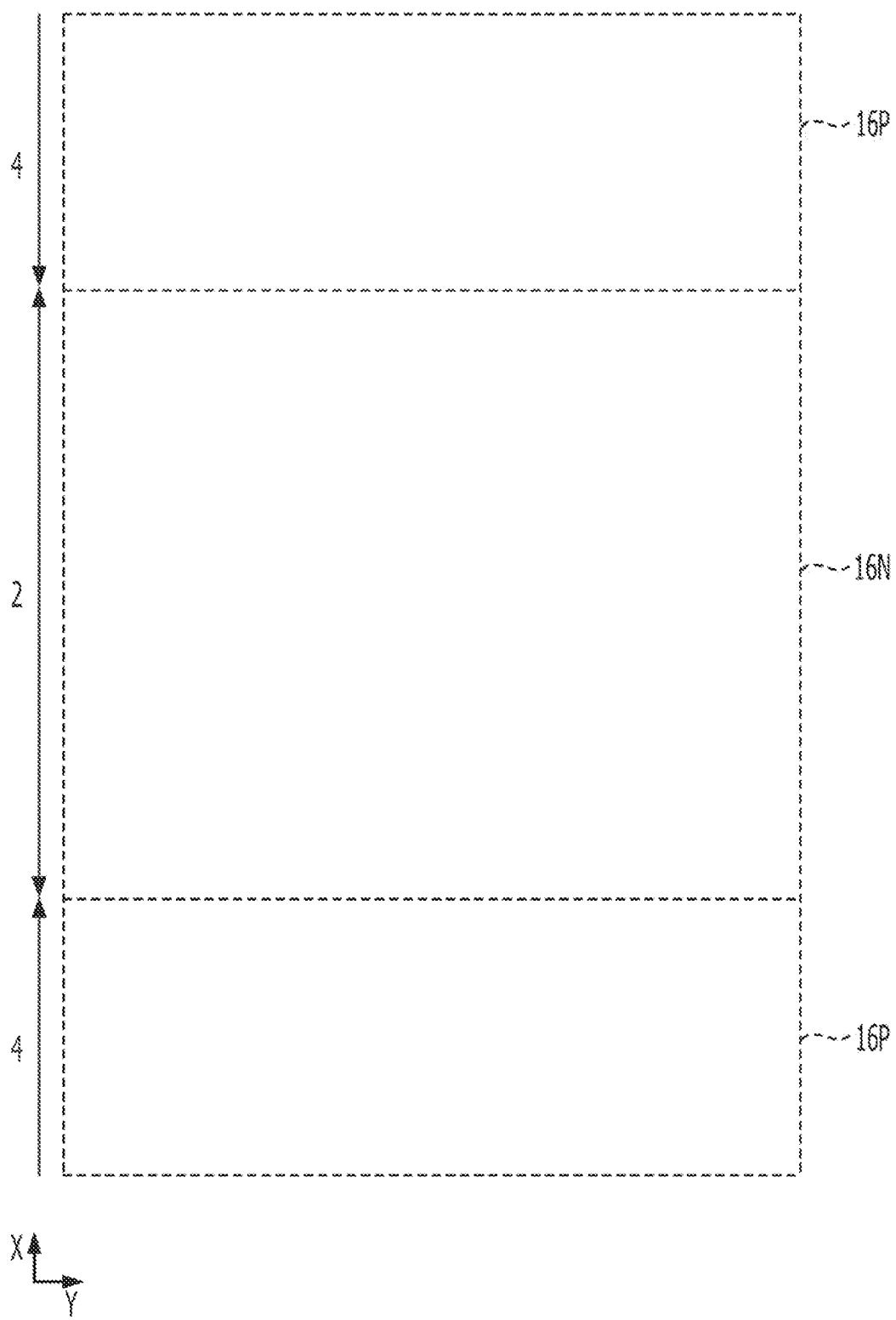
FIG. 5 is a plan view (part 1) illustrating the method for designing a semiconductor device according to the first embodiment.

First, as illustrated in FIGS. 4 and 5, the pattern of the N-type well 16N and the patterns of the P-type wells 16P, which are formed in the semiconductor substrate 10, are laid out (Operation S1).

Figure 6:
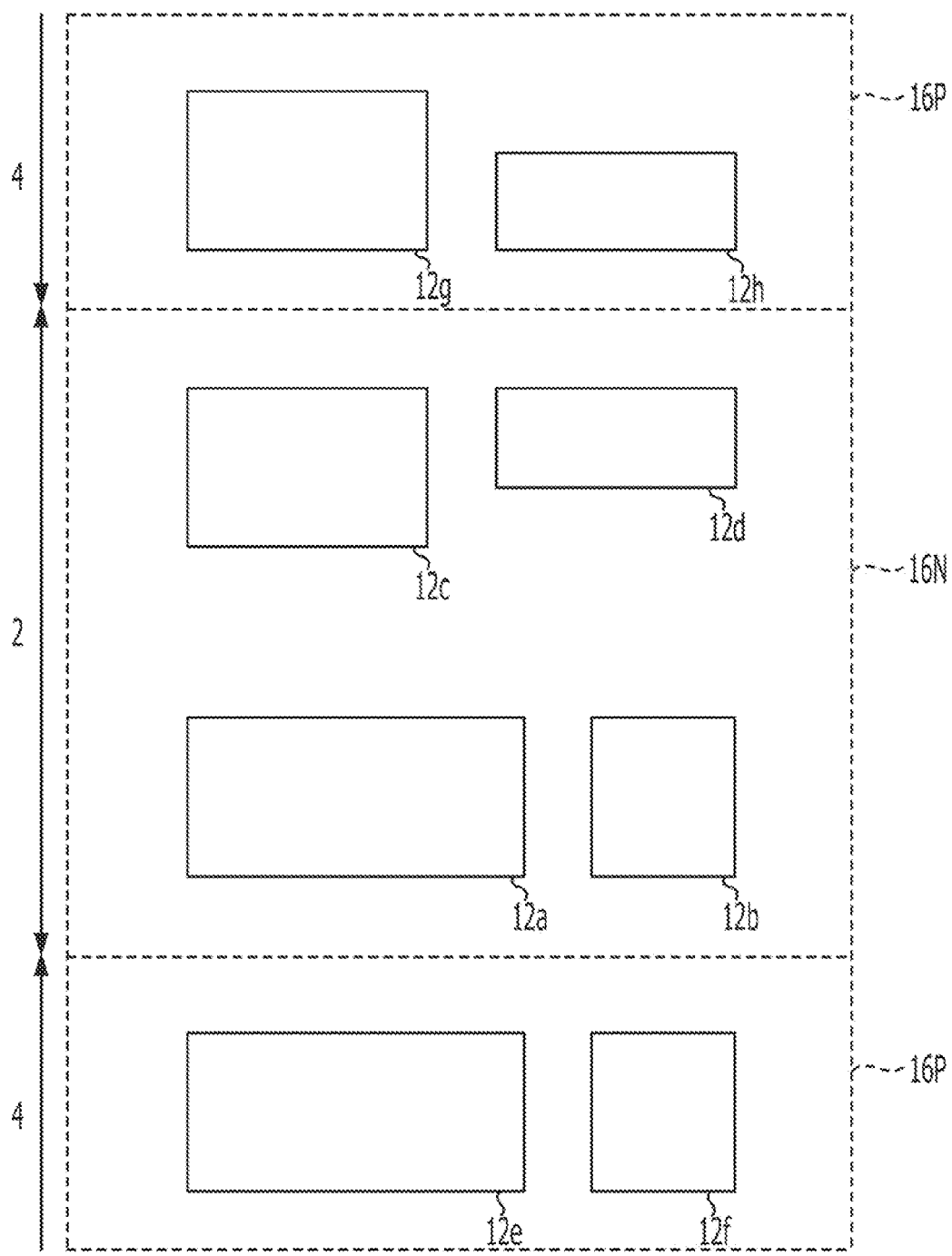
FIG. 6 is a plan view (part 2) illustrating the method for designing a semiconductor device according to the first embodiment.

Next, as illustrated in FIGS. 4 and 6, the patterns of the active region 12a to 12h (element regions) are laid out (Operation S2). The active regions 12a to 12d are arranged in the region 2 in which the PMOS transistors are formed.

The active regions 12e to 12h are arranged in the regions 4 in which the NMOS transistors are formed.

Figure 7:
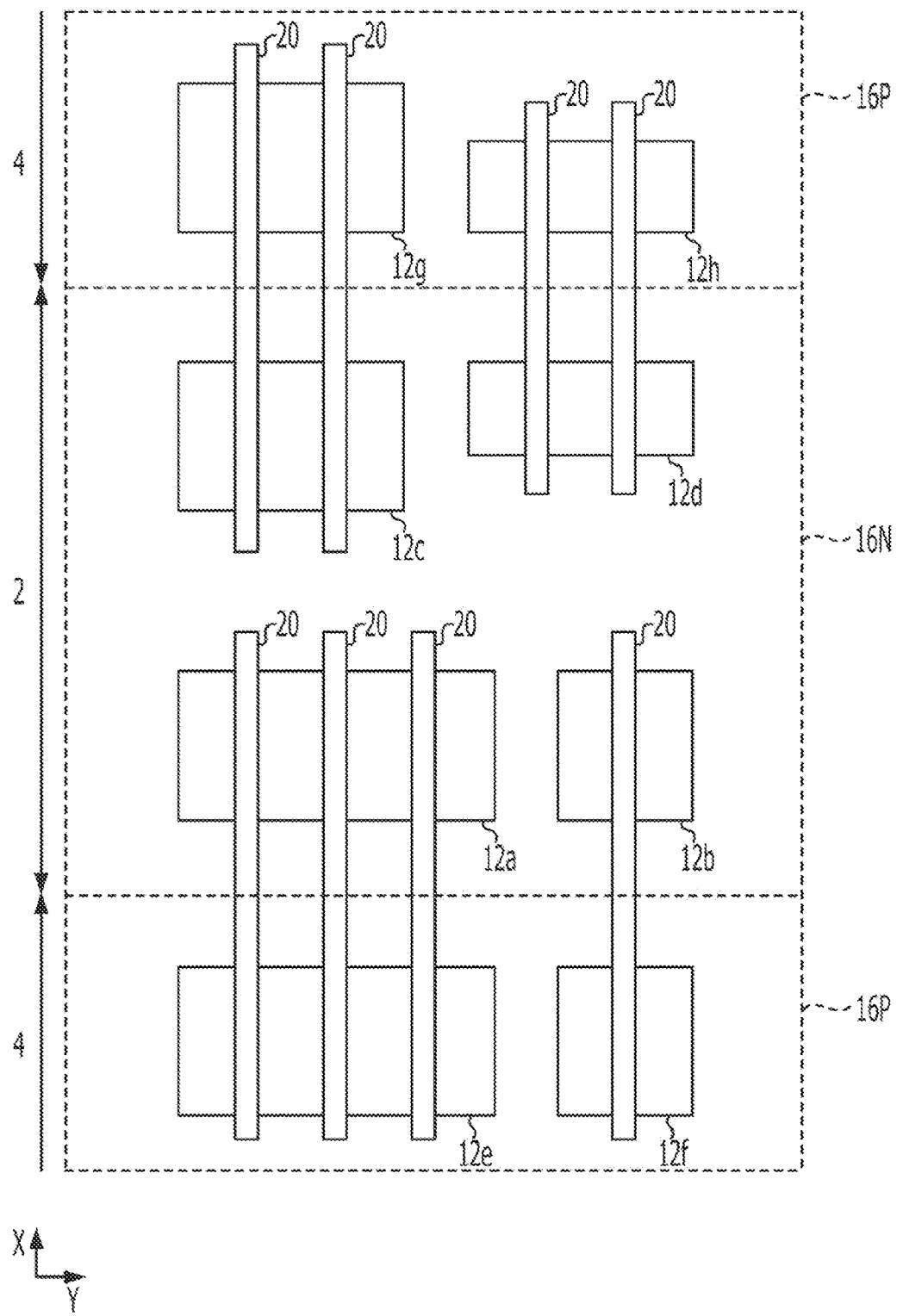
FIG. 7 is a plan view (part 3) illustrating the method for designing a semiconductor device according to the first embodiment.

Next, as illustrated in FIGS. 4 and 7, the patterns of the gate wires 20 are laid out (Operation S3). The gate wires 20 are arranged so as to intersect the active regions 12a to 12h.

Figure 8:
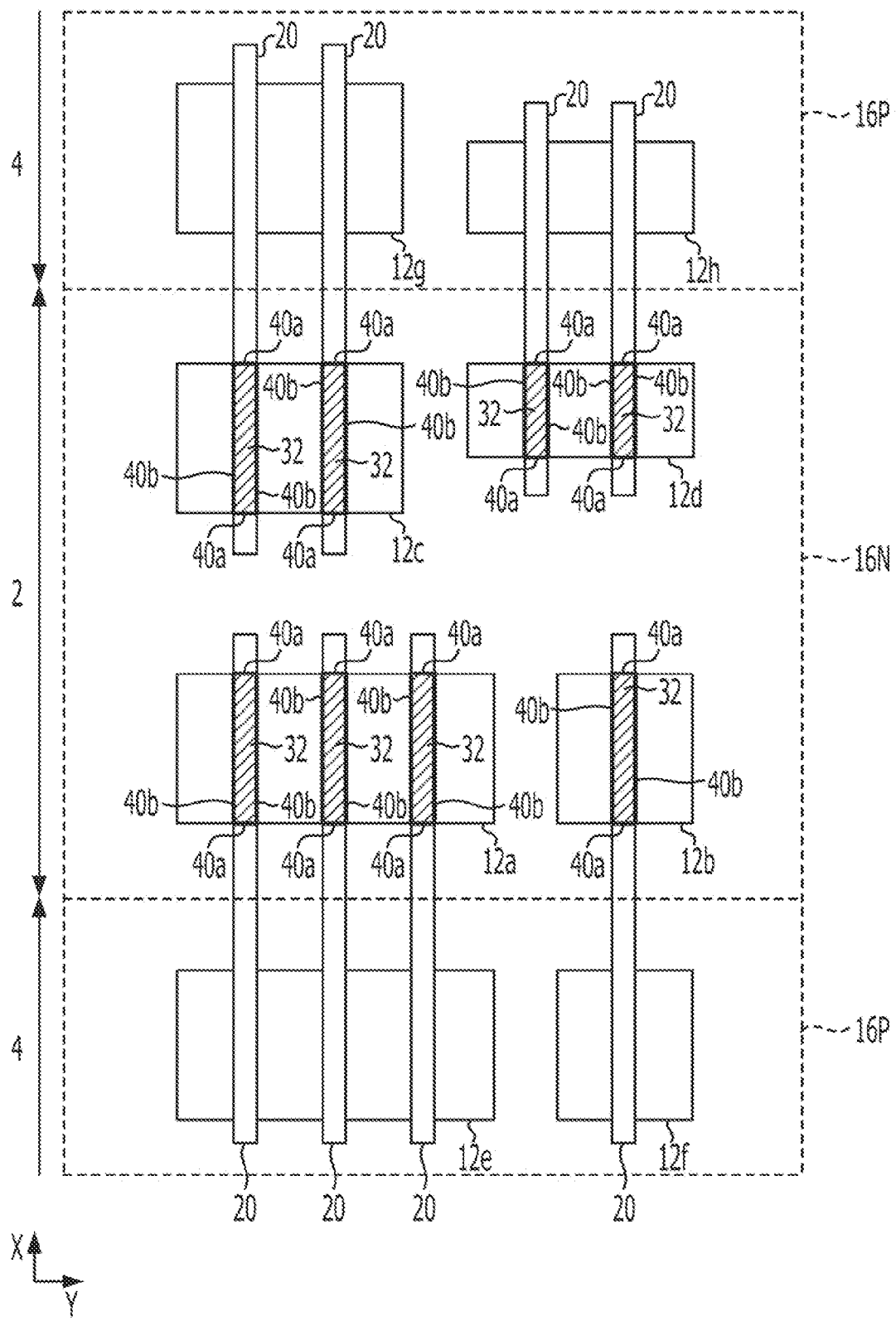
FIG. 8 is a plan view (part 4) illustrating the method for designing a semiconductor device according to the first embodiment.

Next, as illustrated in FIGS. 4 and 8, in the region 2 in which the PMOS transistors are formed, the regions 32 in which the active regions 12a to 12d and the gate wires 20 are overlapped with each other are extracted (Operation S4).

In addition, the positions of the end portions 40a and 40b of the regions 32 are obtained. The end portions 40a are end portions of the active regions 12a to 12d which are located directly under the gate wires 20. The end portions 40b are side portions of the gate wires 20 located on the active regions 12a to 12d.

Figure 9:
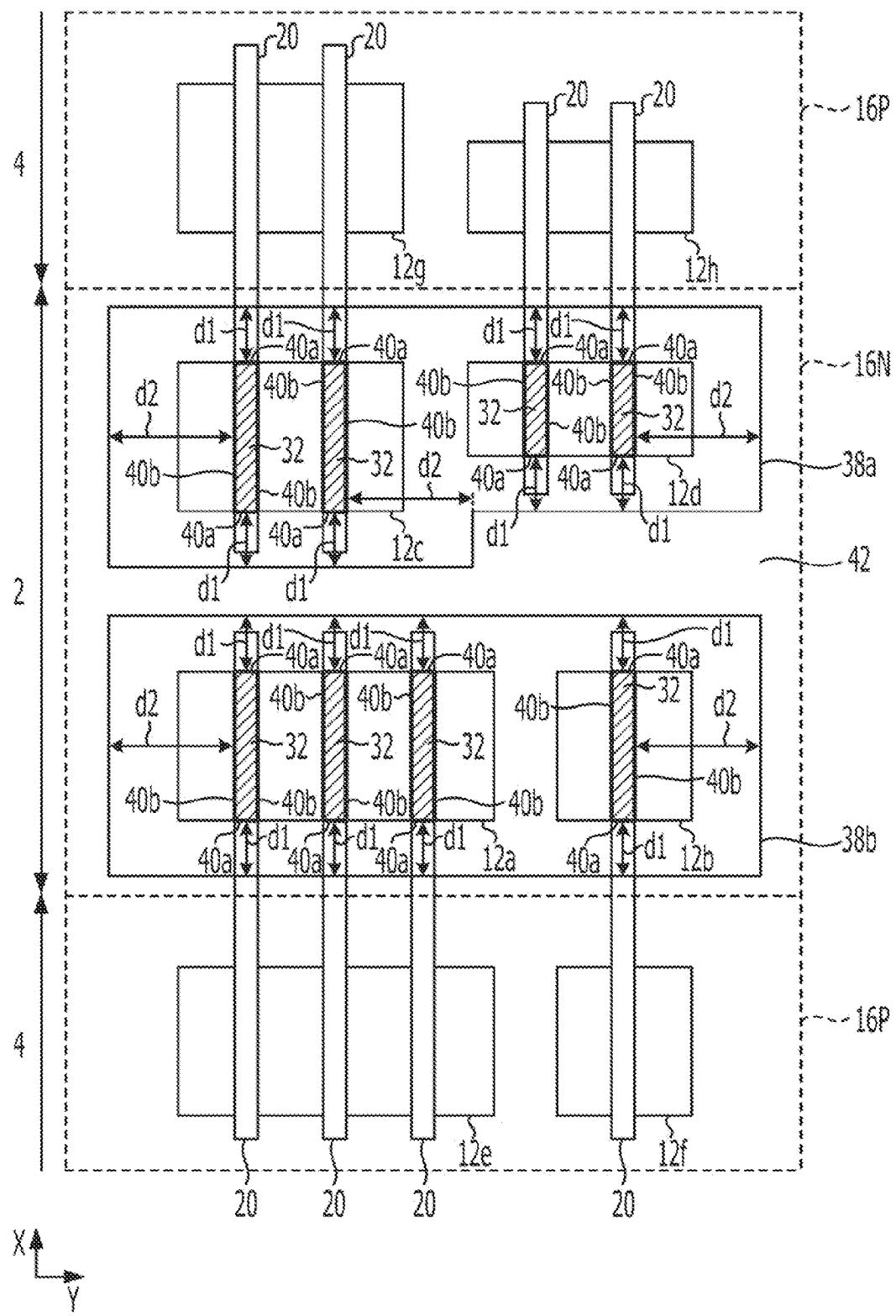
FIG. 9 is a plan view (part 5) illustrating the method for designing a semiconductor device according to the first embodiment.

Next, as illustrated in FIGS. 4 and 9, the patterns of the compressive stress films 38a and 38b are laid out (Operation S5). The compressive stress film 38a is arranged on a region including the active regions 12c and 12d. The compressive stress film 38b is arranged on a region including the active regions 12a and 12b.

The patterns of the compressive stress films 38a and 38b are obtained so that the regions 32 in which the gate wires 20 and the active regions 12a to 12d are overlapped with each other are extended by the first value d1 in the X direction and by the second value d2 in the Y direction, and regions which are overlapped with each other by the extensions are merged together.

Since the regions 32 are extended by the first value d1 in the longitudinal direction (X direction) of the gate wires 20, the distances from the end portions 40a of the regions 32 to the outer ends of the compressive stress films 38a and 38b are all set substantially equal to each other, that is, are all set to the first value d1. Since the regions 32 are extended by the first value d1 in the X direction, the distances in the X direction from the end portions of the active regions 12a to 12d to the end portions of the compressive stress films 38a and 38b are all set to the first value d1.

In order to improve the ON-currents of the PMOS transistors 34, the distances d1 in the longitudinal direction of the gate wires 20 from the end portions 40a of the regions 32 to the boundaries between the compressive stress films 38a and 38b and the tensile stress film 42 are set smaller, for example. However, the distance d1 is set in consideration of the machining accuracy, positioning accuracy of patterns, and the like which are obtained when the active regions 12a to 12d, the compressive stress films 38a and 38b, and the tensile stress film 42 are formed, for example. In this embodiment, the distance d1 is set, for example, to approximately 0.1 to 0.3 µm.

Since the regions 32 are extended by the second value d2 in the direction (Y direction) perpendicular to the longitudinal direction of the gate wires 20, the distances in the Y direction from the end portions 40b of the regions 32 to the outer ends of the compressive stress films 38a and 38a are all set to the second value d2. In order to improve the ON-currents of the PMOS transistors 34, the distance d2 is set larger, for example. In this embodiment, the distance d2 is set, for example, to approximately 0.3 to 1 µm.

Since the second value d2 is relatively large, and the first value d1 is relatively small, the second value d2 is set larger than the first value d1, for example.

Accordingly, the positions of the outer ends of the compressive stress films 38a and 38b are set based on the positions of the end portions 40a and 40b of the regions 32 in which the active regions 12a to 12d and the gate wires 20 are overlapped with each other.

Next, the pattern of the tensile stress film 42 is laid out (Operation S6). The pattern of the tensile stress film 42 is arranged in the region other than the regions in which the compressive stress films 38a and 38b are formed. The positions of the inner ends of the pattern of the tensile stress film 42 are set so as to coincide with the positions of the outer ends of the compressive stress films 38a and 38b. The tensile stress film 42 is arranged on a region including the active regions 12e to 12h.

Accordingly, the positions of the inner ends of the pattern of the tensile stress film 42 are set based on the positions of the end portions 40a and 40b of the regions 32 in which the active regions 12a to 12d and the gate wires 20 are overlapped with each other.

Subsequently, the patterns of the contact holes 46, the patterns of the wires 58 are appropriately set.

As described above, the semiconductor device according to this embodiment is designed. The layout pattern of the semiconductor device thus obtained is stored, for example, in the magnetic disk 305 of the semiconductor design apparatus.

The layout pattern (design pattern) thus formed is used when the semiconductor device according to this embodiment is manufactured.

According to this embodiment, the patterns of the compressive stress films 38a and 38b are produced so that the regions 32 are extended by the first value d1 and the second value d2 in the X direction and the Y direction, respectively, and regions which are partially overlapped with each other by the extensions are merged together. The patterns of the compressive stress films 38a and 38b as described above may be automatically produced by the semiconductor design apparatus. Hence, according to this embodiment, even when a semiconductor device having many PMOS transistors 34 is designed, the distances from the regions 32 to the boundaries between the compressive stress films 38a and 38b and the tensile stress film 42 are all set substantially equal to each other. Hence, according to this embodiment, even in the case of a semiconductor device having many PMOS transistors, the variation in ON-current between the PMOS transistors may be substantially suppressed, and the ON-currents thereof may be improved.

(Method for Manufacturing Semiconductor Device)

Next, the method for manufacturing a semiconductor device according to this embodiment will be described with reference to FIG. 10 (FIGS. 10A and 10B) to FIG. 17 (FIGS. 17A and 17B). FIG. 10 (FIGS. 10A and 10B) to FIG. 15 (FIGS. 15A and 15B) are cross-sectional views illustrating the method for manufacturing a semiconductor device according to this embodiment. FIGS. 10A, 11A, 12A, 13A, 14A, 15A, 16A and 17A are cross-sectional views each taken along the line A-A' of FIG. 1. FIGS. 10B, 11B, 12B, 13B, 14B, 15B, 16B, and 17B are cross-sectional views taken along the line B-B' of FIG. 1.

First, as illustrated in FIGS. 10A and 10B, the element isolation region 14 defining the active regions 12a to 12h (see FIG. 1) is formed in the semiconductor substrate 10 by a shallow trench isolation (STI) method or the like.

When the element isolation region 14 defining the active regions 12a to 12h is formed, the layout pattern (design pattern) obtained by the above method for designing a semiconductor device according to this embodiment is used. As the semiconductor substrate 10, for example, a P-type silicon substrate is used. As described above, the active regions 12a to 12d (see FIG. 1) defined by the element isolation region 14 are formed in the PMOS transistor formation region 2. In addition, the active regions 12e to 12h (see FIG. 1) defined by the element isolation region 14 are formed in the NMOS transistor formation regions 4.

Next, a photoresist film (not illustrated) is formed on the entire surface by a spin coating method or the like.

Next, an opening (not illustrated) through which the PMOS transistor formation region 2 is exposed is formed in the photoresist film using a photolithographic technique.

Next, by using the photoresist film as a mask, an N-type dopant is implanted in the semiconductor substrate 10 by an ion implantation method or the like. Accordingly, the N-type well 16N is formed in the semiconductor substrate 10 in the PMOS transistor formation region 2.

Subsequently, the photoresist film is removed, for example, by ashing.

Next, a photoresist film (not illustrated) is formed on the entire surface by a spin coating method or the like.

Next, openings (not illustrated) through which the NMOS transistor formation regions 4 are exposed are formed in the photoresist film using a photolithographic technique.

Next, by using the photoresist film as a mask, a P-type dopant is implanted in the semiconductor substrate 10 by an ion implantation method or the like. Accordingly, the P-type wells 16P are formed in the semiconductor substrate 10 in the NMOS transistor formation regions 4.

Subsequently, the photoresist film is removed, for example, by ashing.

Figure 11A:
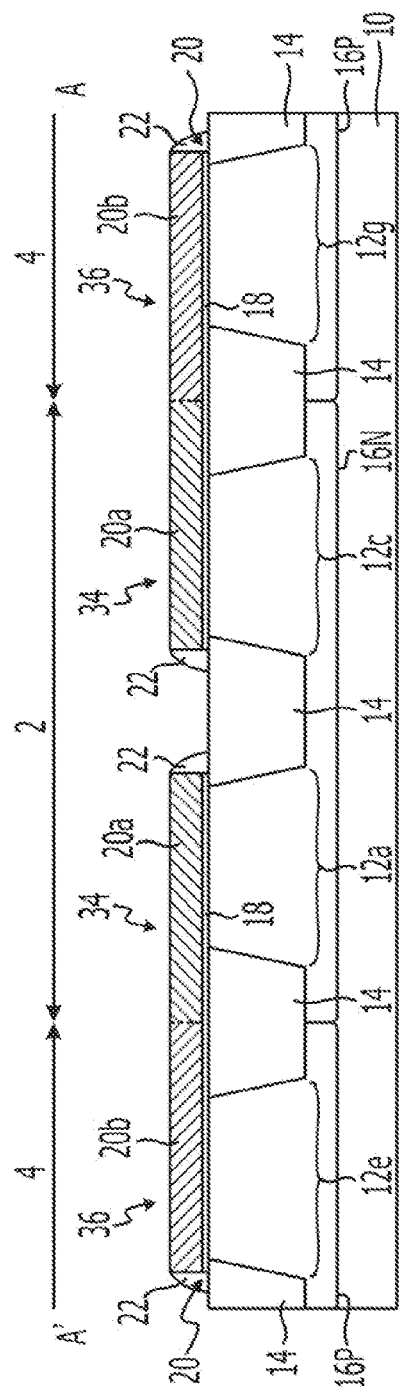
FIGS. 11A and 11B are cross-sectional views (part 2) illustrating the method for manufacturing a semiconductor device according to the first embodiment.
Figure 11B:
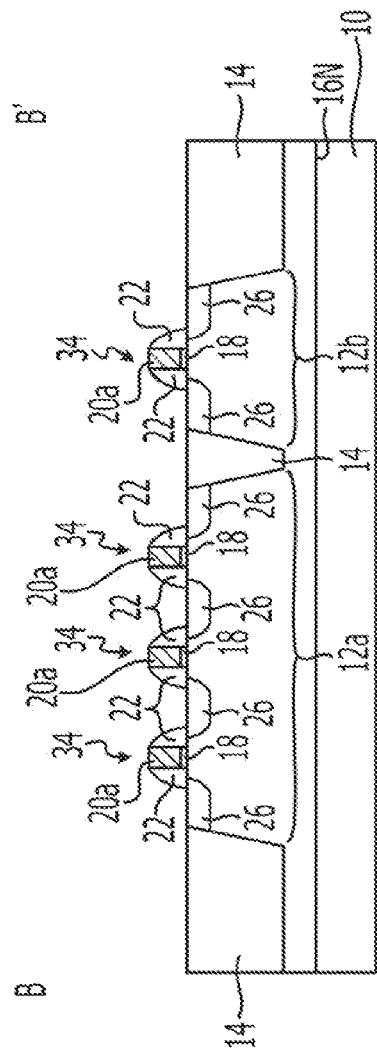

Next, the gate insulating films 18 are formed on the surface of the semiconductor substrate 10 by a thermal oxidation method or the like (see FIGS. 11A and 11B). As the gate insulating film 18, for example, a silicon oxide film is formed. The thickness of the gate insulating film 18 is set, for example, to 1 to 4 nm.

Next, a polysilicon film is formed on the entire surface by a chemical vapor deposition (CVD) method or the like. The polysilicon film is formed into the gate wires 20. The thickness of the polysilicon film is set, for example, to 80 to 120 nm.

Next, a photoresist film (not illustrated) is formed on the entire surface by a spin coating method or the like.

Next, the photoresist film is patterned to have plane shapes of the gate wires 20 using a photolithographic technique. The patterning of the photoresist film is performed based on the layout pattern (design pattern) obtained by the above method for designing a semiconductor device according to this embodiment.

Next, the polysilicon film is etched by using the photoresist film as a mask. Accordingly, the gate wires 20 are formed from the polysilicon film continuously in the PMOS transistor formation region 2 and the NMOS transistor formation regions 4. The gate wires 20 are formed so as to intersect the active regions 12a to 12h.

Next, the photoresist film is removed, for example, by ashing.

Next, a photoresist film (not illustrated) is formed on the entire surface by a spin coating method or the like.

Next, openings (not illustrated) through which the PMOS transistor formation region 2 is exposed are formed in the photoresist film using a photolithographic technique.

Next, by using the photoresist film and the gate wires 20 as a mask, a P-type dopant is implanted in the semiconductor substrate 10 by an ion implantation method or the like. Accordingly, P-type low concentration impurity regions (extension regions) (not illustrated) are formed in the semiconductor substrate 10 at the two sides of each gate wire 20 in the PMOS transistor formation region 2.

Next, the photoresist film is removed, for example, by ashing.

Next, a photoresist film (not illustrated) is formed on the entire surface by a spin coating method or the like.

Next, openings (not illustrated) through which the NMOS transistor formation regions 4 are exposed are formed in the photoresist film using a photolithographic technique.

Next, by using the photoresist film and the gate wires 20 as a mask, an N-type dopant is implanted in the semiconductor substrate 10 by an ion implantation method or the like. Accordingly, N-type low concentration impurity regions (extension regions) (not illustrated) are formed in the semiconductor substrate 10 at the two sides of each gate wire 20 in the NMOS transistor formation regions 4.

Next, the photoresist film is removed, for example, by ashing.

Next, an insulating film is formed on the entire surface by a CVD method or the like. This insulating film is formed into the sidewall insulating films. As this insulating film, for example, a silicon oxide film is formed. The thickness of the insulating film is set, for example, to 10 to 100 nm.

Next, the insulating film is processed, for example, by anisotropic etching. Accordingly, the sidewall insulating films 22 are formed on the sidewall portions of each gate wire 20.

Next, a photoresist film (not illustrated) is formed on the entire surface by a spin coating method or the like.

Next, openings (not illustrated) through which the PMOS transistor formation region 2 is exposed are formed in the photoresist film using a photolithographic technique.

Next, by using the photoresist film, the gate wires 20, and the sidewall insulating film 22 as a mask, a P-type dopant is implanted in the semiconductor substrate 10 by an ion implantation method or the like. As the P-type dopant, for example, boron is used. Accordingly, P-type high concentration impurity regions (not illustrated) are formed in the semiconductor substrate 10 at the two sides of each gate wire 20 in the PMOS transistor formation region 2. Hence, the source/drain diffusion layers 26 having an extension source/drain structure are each formed from the low concentration impurity region (extension region) and the high concentration impurity region.

When being implanted, the P-type dopant forming the source/drain diffusion layers 26 is also implanted in the gate wires 20 in the PMOS transistor formation region 2. As a result, the gate wires 20 in the PMOS transistor formation region 2 are formed into the gate electrodes 20a in each of which the P-type dopant is implanted.

Next, the photoresist film is removed, for example, by ashing.

Next, a photoresist film (not illustrated) is formed on the entire surface by a spin coating method or the like.

Next, openings (not illustrated) through which the NMOS transistor formation regions 4 are exposed are formed in the photoresist film using a photolithographic technique.

Next, by using the photoresist film, the gate wires 20, and the sidewall insulating films 22 as a mask, an N-type dopant is implanted in the semiconductor substrate 10 by an ion implantation method or the like. As the N-type dopant, for example, phosphorus is used. Accordingly, N-type high concentration impurity regions (not illustrated) are formed in the semiconductor substrate 10 at the two sides of each gate wire 20 in the NMOS transistor formation regions 4. Accordingly, the source /drain diffusion layers 30 having an extension source/drain structure are each formed from the low concentration impurity region (extension region) (not illustrated) and the high concentration impurity region (not illustrated) (see FIG. 1).

When being implanted, the N-type dopant forming the source/drain diffusion layers 30 is also implanted in the gate wires 20 in the NMOS transistor formation regions 4.

As a result, the gate wires 20 in the NMOS transistor formation regions 4 are formed into the gate electrodes 20b in each of which the N-type dopant is implanted.

Next, the photoresist film is removed, for example, by ashing.

Next, a high melting point metal film is formed on the entire surface. As the high melting point metal film mentioned above, for example, a nickel film or a cobalt film is formed. When a nickel film is used as the high melting point metal film, the thickness thereof is set, for example, to approximately 15 to 25 nm. When a cobalt film is used as the high melting point metal film, the thickness thereof is set, for example, to approximately 3 to 6 nm.

Next, silicon atoms in the semiconductor substrate 10 and metal atoms in the high melting point metal film are allowed to react with each other by a heat treatment. In addition, silicon atoms in the gate wires 20 and metal atoms in the high melting point metal film are also allowed to react with each other. When a nickel film is used as the high melting point metal film, the temperature for the heat treatment is set, for example, to approximately 200° C. to 250° C. When a cobalt film is used as the high melting point metal film, the temperature for the heat treatment is set, for example, to approximately 500° C. to 550° C.

Next, an unreacted portion of the high melting point metal film is removed by etching. As an etching solution, for example, a mixture of ammonia and a hydrogen peroxide solution is used. Alternatively, as the etching solution, a mixed liquid of sulfuric acid and a hydrogen peroxide solution may also be used.

Next, a heat treatment is further performed to promote the reaction between silicon atoms in the semiconductor substrate 10 and high melting point metal atoms and also to promote the reaction between silicon atoms in the gate wires 20 and high melting point metal atoms. When a nickel film is used as the high melting point metal film, the temperature for the heat treatment is set, for example, to approximately 350° C. to 450° C. When a cobalt film is used as the high melting point metal film, the temperature for the heat treatment is set, for example, to approximately 650° C. to 750° C.

Accordingly, the silicide layers (not illustrated) are formed on the source/drain diffusion layers 26 and 30.

The silicide layers formed on the source/drain diffusion layers 26 and 30 function as the source/drain electrodes.

In addition, a silicide layer (not illustrated) is also formed on the upper portion of each gate wire 20.

Accordingly, the PMOS transistors 34 each having the gate electrode 20a, the source/drain diffusion layers 26, and the like are formed in the PMOS transistor formation region 2. In addition, the NMOS transistor 36 each having the gate electrode 20b, the source/drain diffusion layers 30, and the like are formed in the NMOS transistor formation regions 4.

Figure 12A:
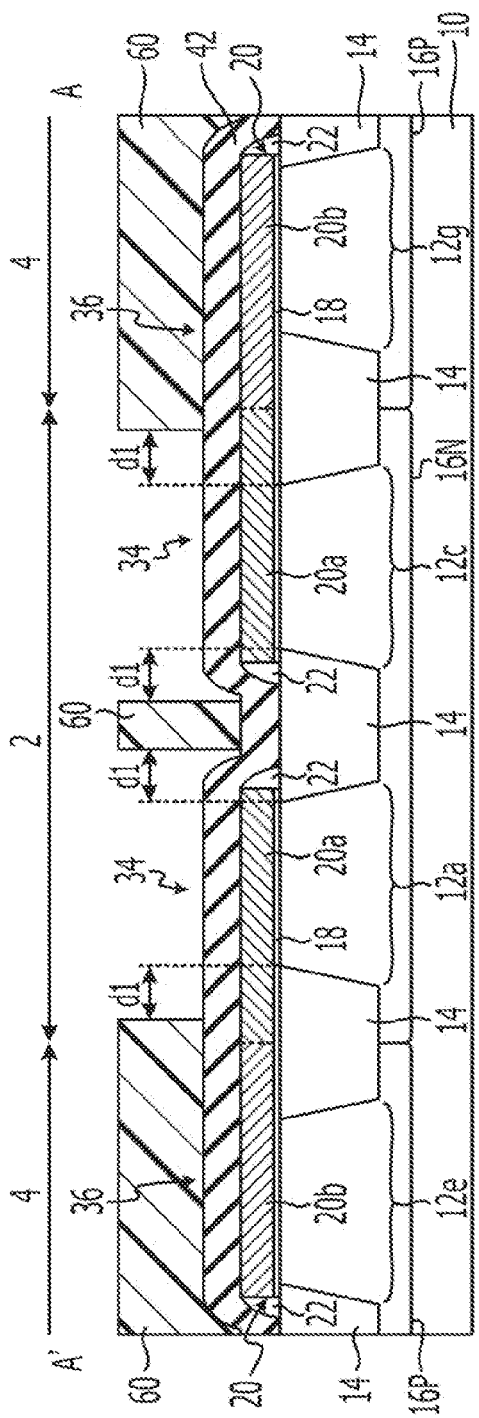
FIGS. 12A and 12B are cross-sectional views (part 3) illustrating the method for manufacturing a semiconductor device according to the first embodiment.
Figure 12B:
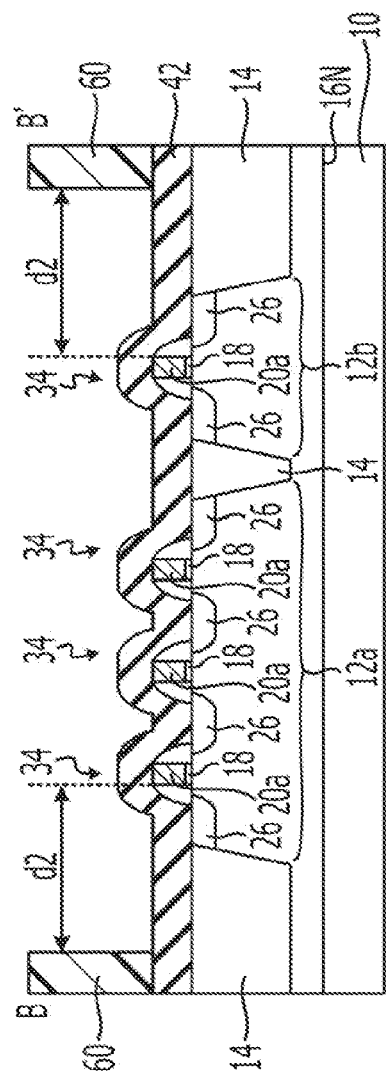

Next, a solid tensile stress film 42 is formed on the entire surface by a plasma CVD method or the like (see FIGS. 12A and 12B). The solid tensile stress film 42 is formed into the tensile stress film 42 which applies a tensile stress to the channel region of each NMOS transistor 36 so as to improve the carrier mobility thereof.

The solid tensile stress film 42 may be formed, for example, under the following conditions. That is, the solid tensile stress film 42 is formed in a vacuum chamber, for example, using a parallel plate type plasma CVD apparatus. The substrate temperature forming the solid tensile stress film 42 is set, for example, to approximately 400° C. In the vacuum chamber, for example, an $N_2$ gas, an $NH_3$ gas, and a $SiH_4$ gas are supplied substantially simultaneous. The flow rate of an $N_2$ gas is set, for example, to 500 to 3,000 sccm. The flow rate of an $NH_3$ gas is set, for example, to 100 to 1,000 sccm. The flow rate of a $SiH_4$ gas is set, for example, to 200 to 500 sccm. The pressure inside the chamber is set, for example, to 1 to 15 Torr. The frequency of a high-frequency electrical power to be applied is set, for example, to 13.56 MHz. The high-frequency electrical power to be applied is set, for example, to approximately 100 to 500 W. The time forming the solid tensile stress film 42, that is, the time of plasma excitation, is set, for example, to approximately 10 to 100 seconds. Accordingly, a silicon nitride film is formed on the entire surface. Next, the silicon nitride film is irradiated with ultraviolet rays using a UV irradiation apparatus. As a source of ultraviolet rays, an ultraviolet source having a broad wavelength spectrum is used. As an atmosphere for the ultraviolet radiation, for example, a He atmosphere is used. The time for the ultraviolet radiation is set, for example, to approximately 180 to 600 seconds. The thickness of the solid tensile stress film 42 is set, for example, to approximately 30 to 90 nm.

Accordingly, the solid tensile stress film 42 is formed from a silicon nitride film.

Next, a photoresist film 60 is formed on the entire surface by a spin coating method or the like.

Next, the photoresist film 60 is patterned using a photolithography technique (see FIGS. 12A and 12B). The photoresist film 60 is used to pattern the solid tensile stress film 42. The patterning of the photoresist film 60 is performed based on the layout pattern (design pattern) obtained by the above method for designing a semiconductor device according to this embodiment.

The positions of the inner ends of the pattern of the photoresist film 60 are set based on the positions of the end portions 40a and 40b of the regions 32 in which the gate wires 20 and the active regions 12a to 12d are overlapped with each other.

The distances in the longitudinal direction of the gate wires 20 from the end portions 40a of the regions 32 in which the gate wires 20 and the active regions 12a to 12d are overlapped with each other to the inner ends of the pattern of the photoresist film 60 are all set to the first value d1.

The distances in the direction perpendicular to the longitudinal direction of the gate wires 20 from the end portions 40b of the regions 32 in which the gate wires 20 and the active regions 12a to 12d are overlapped with each other to the inner ends of the pattern of the photoresist film 60 are all set to the second value d2.

Next, anisotropic etching of the solid tensile stress film 42 is carried out by using the photoresist film 60 as a mask. Accordingly, the solid tensile stress film 42 is formed into the tensile stress film 42 by patterning.

The positions of the end portions (inner ends portions) of the tensile stress film 42 are set based on the positions of the end portions 40a and 40b of the regions 32 in which the gate wires 20 and the active regions 12a to 12d are overlapped with each other.

The distances in the longitudinal direction of the gate wires 20 from the end portions 40a of the regions 32 in which the gate wires 20 and the active regions 12a to 12d are overlapped with each other to the inner ends of the tensile stress film 42 are all set to the first value d1.

The distances in the direction perpendicular to the longitudinal direction of the gate wires 20 from the end portions 40b of the regions 32 in which the gate wires 20 and the active regions 12a to 12d are overlapped with each other to the inner ends of the tensile stress film 42 are all set to the second value d2.

Figure 13A:
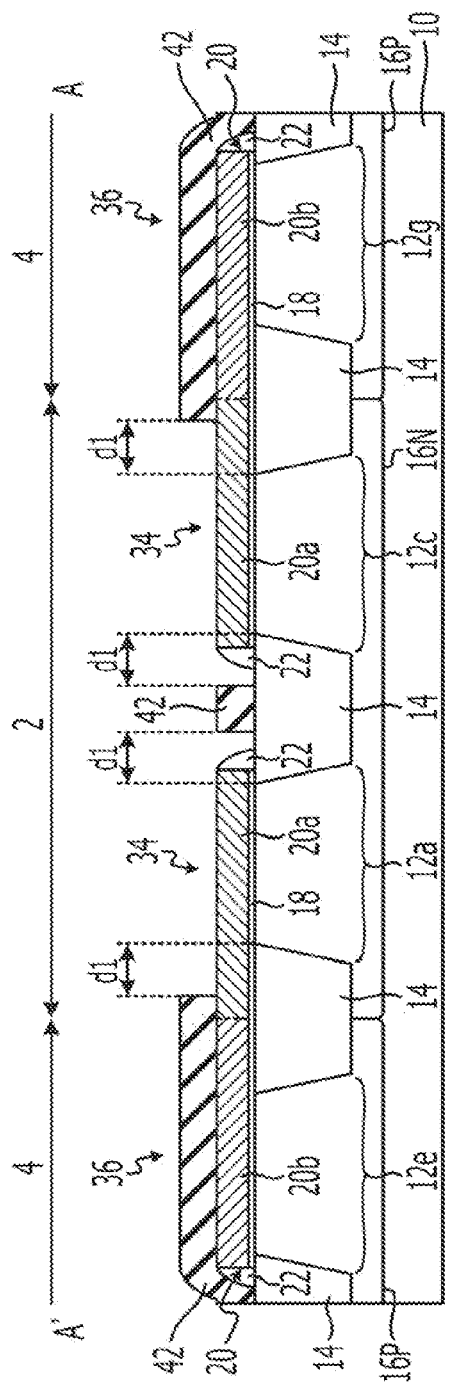
FIGS. 13A and 13B are cross-sectional views (part 4) illustrating the method for manufacturing a semiconductor device according to the first embodiment.
Figure 13B:
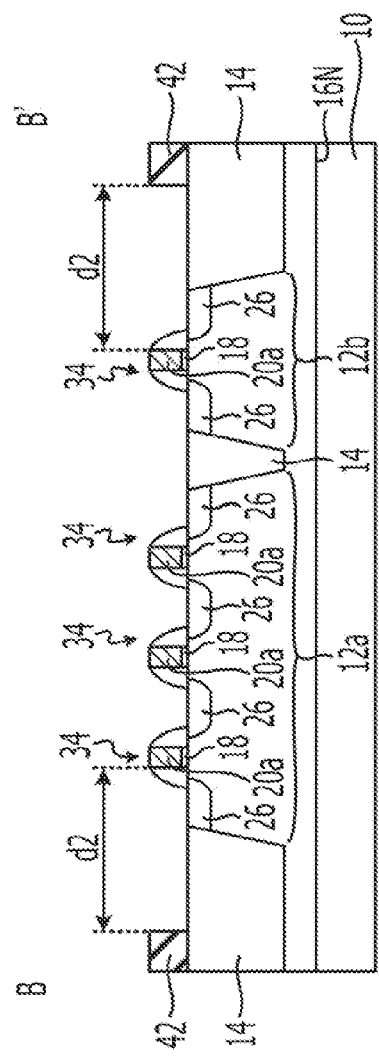

Next, the photoresist film 60 is removed, for example, by ashing (see FIGS. 13A and 13B).

Figures 14A, 14B:
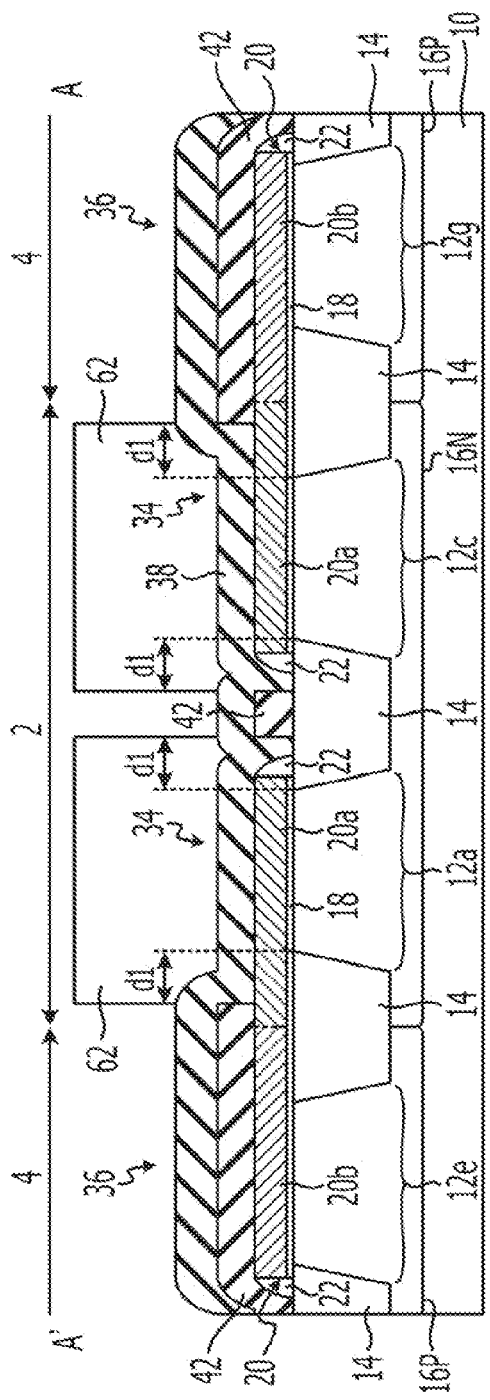
FIGS. 14A and 14B are cross-sectional views (part 5) illustrating the method for manufacturing a semiconductor device according to the first embodiment.

Next, a compressive stress film 38 is formed on the entire surface by a plasma CVD method or the like (see FIGS. 14A and 14B). The compressive stress film 38 is a film formed into the compressive stress films 38a and 38b, each of which applies a compressive stress to the channel region of each PMOS transistor 34 so as to improve the carrier mobility thereof.

The compressive stress film 38 may be formed, for example, under the following conditions. That is, the compressive stress film 38 is formed in a vacuum chamber, for example, using a parallel plate type plasma CVD apparatus. The substrate temperature forming the compressive stress film 38 is set, for example, to approximately 400° C. In the vacuum chamber, for example, an $N_2$ gas, a $H_2$ gas, an $NH_3$ gas, a $SiH_4$ gas, and a $(CH_3)_3SiH$ gas (trimethylsilane gas) are supplied substantially simultaneous. The flow rate of an $N_2$ gas is set, for example, to 500 to 3,000 sccm. The flow rate of a $H_2$ gas is set, for example, to 500 to 3,000 sccm. The flow rate of an $NH_3$ gas is set, for example, to 100 to 1,000 sccm. The flow rate of a $SiH_4$ gas is set, for example, to 200 to 500 sccm. The flow rate of a $(CH_3)_3SiH$ gas is set, for example, to 50 to 150 sccm. The pressure inside the chamber is set, for example, to 1 to 10 Torr. The frequency of a high-frequency electrical power to be applied is set, for example, to 13.56 MHz. The high-frequency electrical power to be applied is set, for example, to approximately 100 to 500 W. The time forming the compressive stress film 38, that is, the time of plasma excitation, is set, for example, to approximately 10 to 100 seconds. Accordingly, the compressive stress film 38 is formed from a silicon nitride film. The thickness of the compressive stress film 38 is set, for example, to approximately 30 to 90 nm.

Accordingly, the compressive stress film 38 is formed on the entire surface.

Next, a photoresist film 62 is formed on the entire surface by a spin coating method or the like.

Next, the photoresist film 62 is patterned using a photolithographic technique. The photoresist film 62 is used to pattern the compressive stress film 38. The patterning of the photoresist film 62 is performed based on the layout pattern (design pattern) obtained by the above method for designing a semiconductor device according to this embodiment.

The positions of the inner ends of the pattern of the photoresist film 62 are set based on the positions of the end portions 40a and 40b of the regions 32 in which the gate wires 20 and the active regions 12a to 12d are overlapped with each other.

The distances in the longitudinal direction of the gate wires 20 from the end portions 40a of the regions 32 in which the gate wires 20 and the active regions 12a to 12d are overlapped with each other to the outer ends of the pattern of the photoresist film 62 are all set to the first value d1.

The distances in the direction perpendicular to the longitudinal direction of the gate wires 20 from the end portions 40b of the regions 32 in which the gate wires 20 and the active regions 12a to 12d are overlapped with each other to the outer ends of the pattern of the photoresist film 62 are all set to the second value d2.

Next, anisotropic etching of the compressive stress film 38 is carried out by using the photoresist film 62 as a mask.

The positions of the outer ends of the compressive stress films 38a and 38b are set based on the positions of the end portions 40a and 40b of the regions 32 in which the gate wires 20 and the active regions 12a to 12d are overlapped with each other.

The distances in the longitudinal direction of the gate wires 20 from the end portions 40a of the regions 32 in which the gate wires 20 and the active regions 12a to 12d are overlapped with each other to the outer ends of the compressive stress films 38a and 38b are all set to the first value d1.

The distances in the direction perpendicular to the longitudinal direction of the gate wires 20 from the end portions 40b of the regions 32 in which the gate wires 20 and the active regions 12a to 12d are overlapped with each other to the outer ends of the compressive stress films 38a and 38b are all set to the second value d2.

Figure 15A:
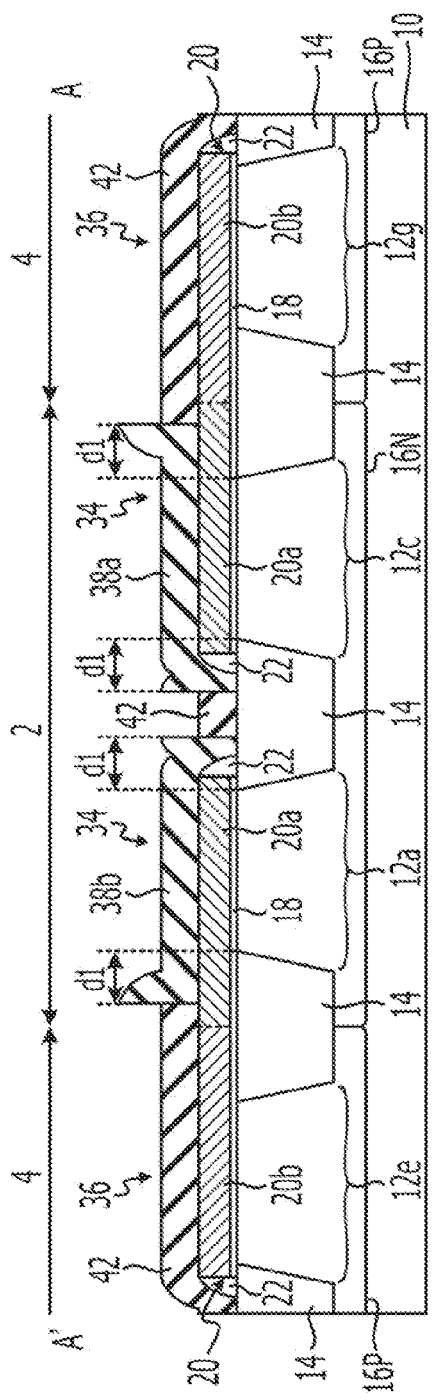
FIGS. 15A and 15B are cross-sectional views (part 6) illustrating the method for manufacturing a semiconductor device according to the first embodiment.
Figure 15B:
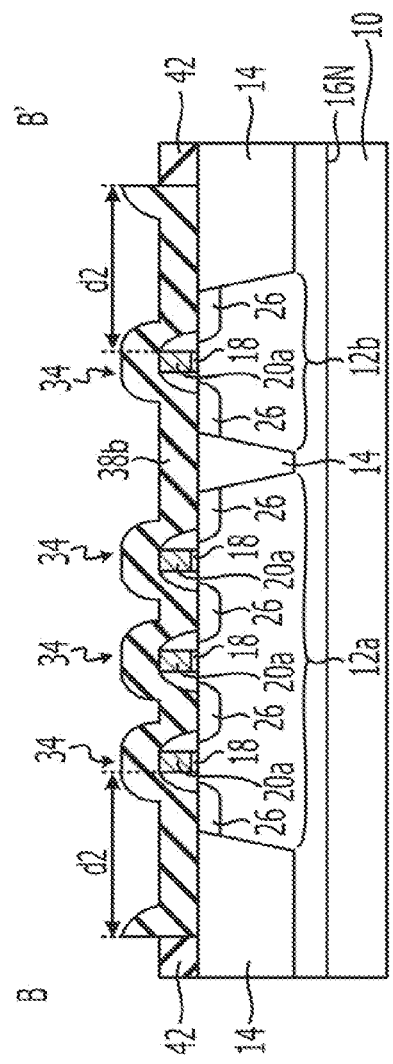

Next, the photoresist film 62 is removed, for example, by ashing (see FIGS. 15A and 15B).

Figure 16A:
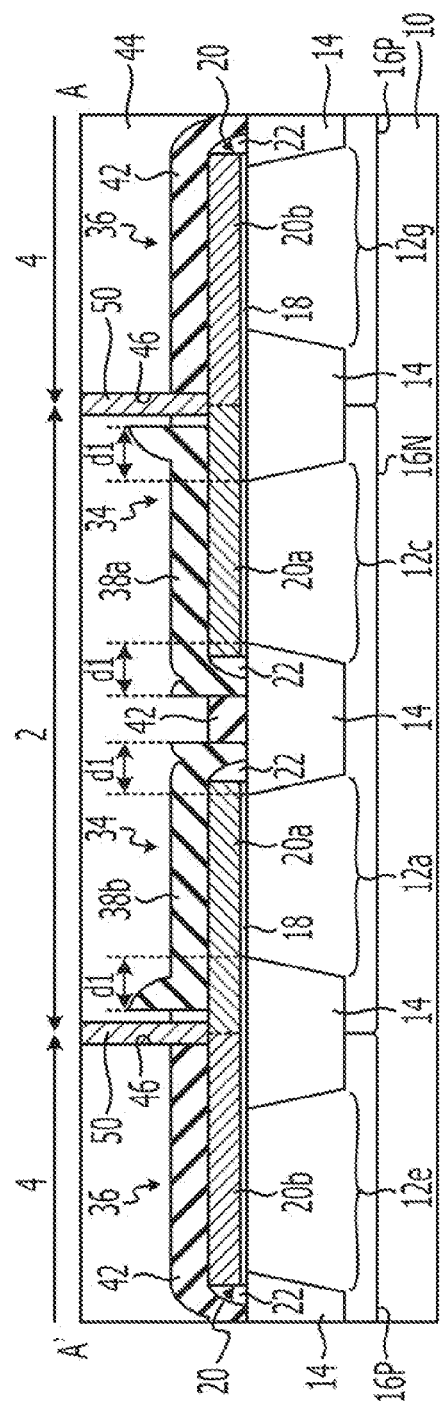
FIGS. 16A and 16B are cross-sectional views (part 7) illustrating the method for manufacturing a semiconductor device according to the first embodiment.
Figure 16B:
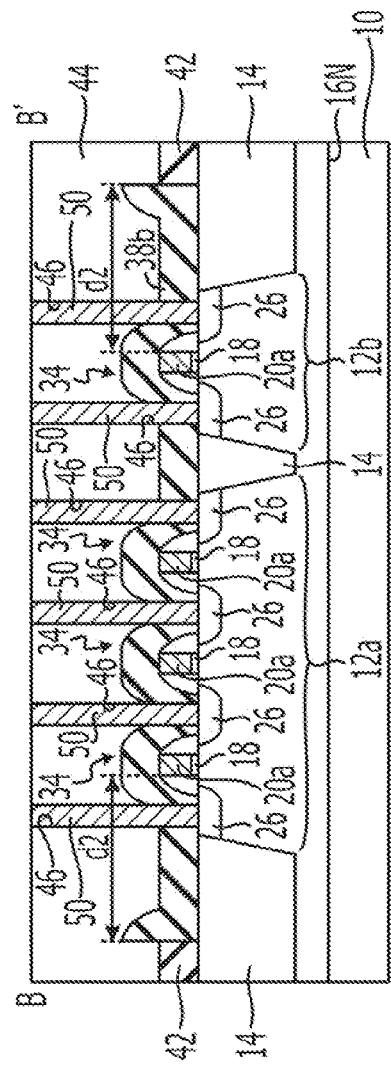

Next, the interlayer insulation film 44 is formed on the entire surface by a CVD method or the like (see FIGS. 16A and 16B). The thickness of the interlayer insulation film 44 is set, for example, to approximately 200 to 400 nm.

As the interlayer insulation film 44, for example, a silicon oxide film or a phosphosilicate glass (PSG) film is formed.

Next, the surface of the interlayer insulation film 44 is planarized, for example, by a chemical mechanical polishing (CMP) method.

Next, the interlayer insulation film 44, the tensile stress film 42, and the compressive stress films 38a and 38b are etched using a photolithographic technique. Accordingly, the contact holes 46 are formed so as to reach the gate wires 20. In addition, the contact holes 46 are formed which reach the source/drain electrodes (not illustrated) formed on the source/drain diffusion layers 26 and 30.

Next, a barrier metal film (not illustrated) is formed on the entire surface by a sputtering method or the like.

The barrier metal film is formed, for example, by sequentially laminating a Ti film (not illustrated) and a TiN film (not illustrated). The thickness of the Ti film is set, for example, to approximately 6 to 10 nm. The thickness of the TiN film is set, for example, to approximately 1 to 10 nm.

Next, a conductive film is formed on the entire surface by a CVD method or the like. The conductive film is formed into the conductor plugs 50. As the conductive film, for example, a tungsten film is formed. The thickness of the conductive film is set, for example, to approximately 100 to 200 nm.

Next, the conductive film and the barrier metal film are polished, for example, by a CMP method until the surface of the interlayer insulation film 44 is exposed. Accordingly, the conductor plug 50 is filled in each contact hole 46 in which the barrier metal film is formed (see FIGS. 16A and 16B). Some conductor plugs 50 are connected to the gate wires 20 in the vicinities of boundary portions between the PMOS transistor formation region 2 and the NMOS transistor formation regions 4. In addition, some conductor plugs 50 are connected to the source/drain electrodes (not illustrated) formed on the source/drain diffusion layers 26 of the PMOS transistors 34. In addition, some conductor plugs 50 are connected to the source/drain electrodes (not illustrated) formed on the source/drain diffusion layers 30 (see FIG. 1) of the NMOS transistors 36.

Next, the interlayer insulation film 52 is formed on the entire surface by a CVD method or the like (see FIGS. 17A and 17B). As the interlayer insulation film 52, for example, a silicon oxide film is formed. The thickness of the interlayer insulation film 52 is set, for example, to 200 to 400 nm.

Next, the grooves 54 in which the wires 58 are to be filled are formed in the interlayer insulation film 52 using a photolithographic technique. The upper surface of the conductor plug 50 is exposed at the bottom of each groove 54.

Next, a barrier metal film (not illustrated) is formed on the entire surface by a sputtering method or the like.

As the barrier metal film, for example, a Ta film is formed.

Next, a seed layer (not illustrated) is formed on the entire surface by a sputtering method or the like. This seed layer is used when a conductive film is formed in a subsequent step by an electroplating method. As the seed layer, for example, a Cu film is formed. The thickness of the seed layer is set, for example, to approximately 50 to 80 nm.

Next, the conductive film is formed on the entire surface by an electroplating method or the like. As the conductive film, for example, a Cu film is formed. The thickness of the conductive film is set, for example, to 800 to 1,000 nm.

Next, the conductive film, the seed layer, and the barrier metal film are polished, for example, by a CMP method until the surface of the interlayer insulation film 52 is exposed. Accordingly, the wires 58 formed from the conductive film are filled in the grooves 54 in each of which the barrier metal film is formed.

Accordingly, the semiconductor device according to this embodiment is manufactured.

According to this embodiment, the patterns of the compressive stress films 38a and 38b are produced so that the regions 32 are extended by the first value d1 and the second value d2 in the X direction and the Y direction, respectively, and regions which are partially overlapped with each other by the extensions are merged together. The patterns of the compressive stress films 38a and 38b as described above may be automatically produced by a semiconductor design apparatus. Hence, according to this embodiment, even if a semiconductor device including many PMOS transistors 34 is designed, the distances from the regions 32 to the boundaries between the compressive stress films 38a and 38b and the tensile stress film 42 are all easily set substantially equal to each other. Accordingly, even in the case of a semiconductor device including many PMOS transistors, the variation in ON-current between the PMOS transistors may be substantially suppressed, and further the ON-currents thereof may be improved.

[Second Embodiment]

A semiconductor device, a method for designing a semiconductor device, and a method for manufacturing a semiconductor device, each according to a second embodiment, will be described with reference to FIGS. 18 to 26. Substantially the same constituent elements as those of the semiconductor device, the method for designing the same, and the method for manufacturing a semiconductor device, each according to the first embodiment, which are illustrated in FIGS. 1 to 17B, will be designated by the same reference numerals as those of the first embodiment, and descriptions thereof will be omitted or simplified.

(Semiconductor Device)

Figure 18:
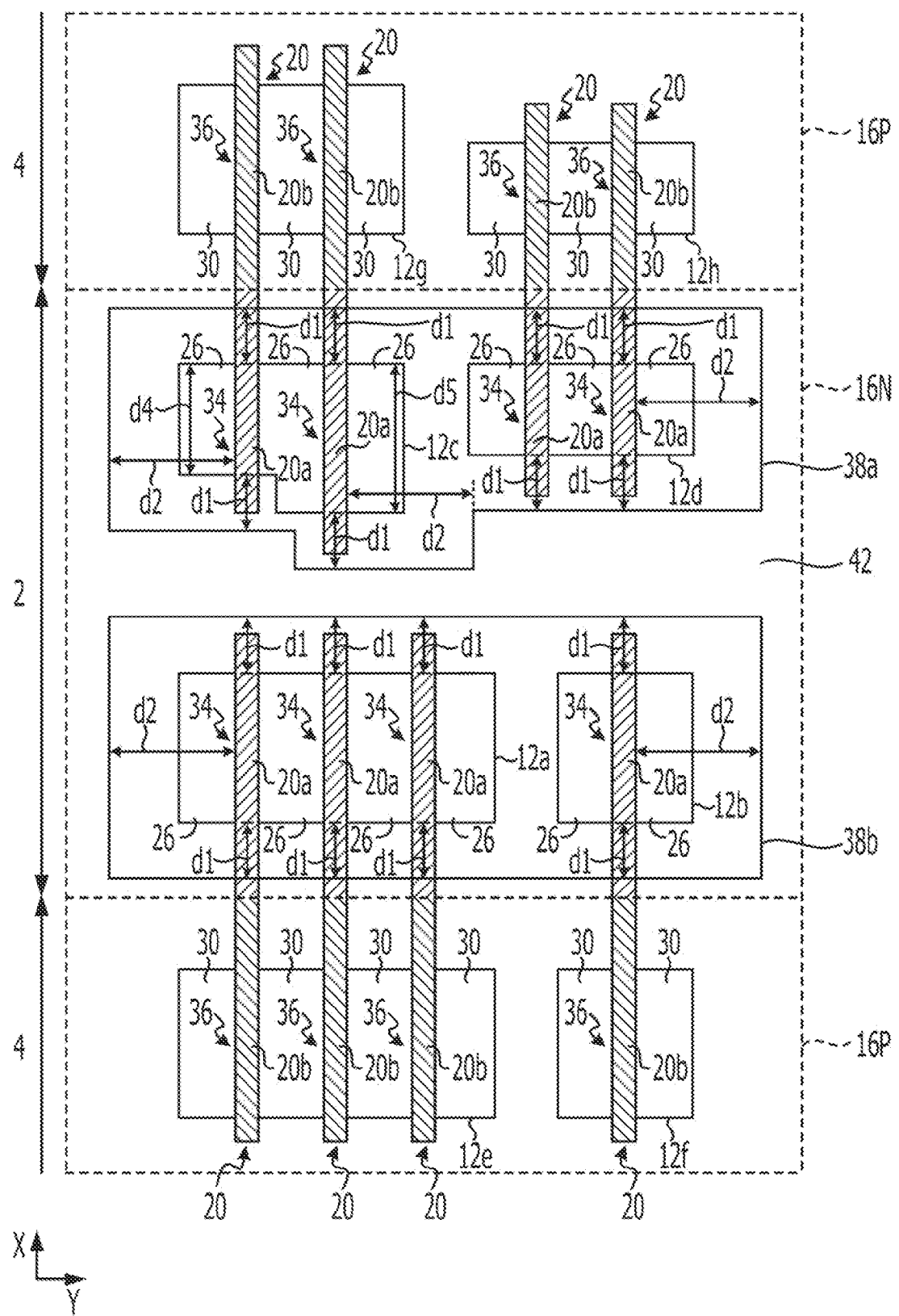
FIG. 18 is a plan view illustrating a semiconductor device according to a second embodiment.
Figure 19:
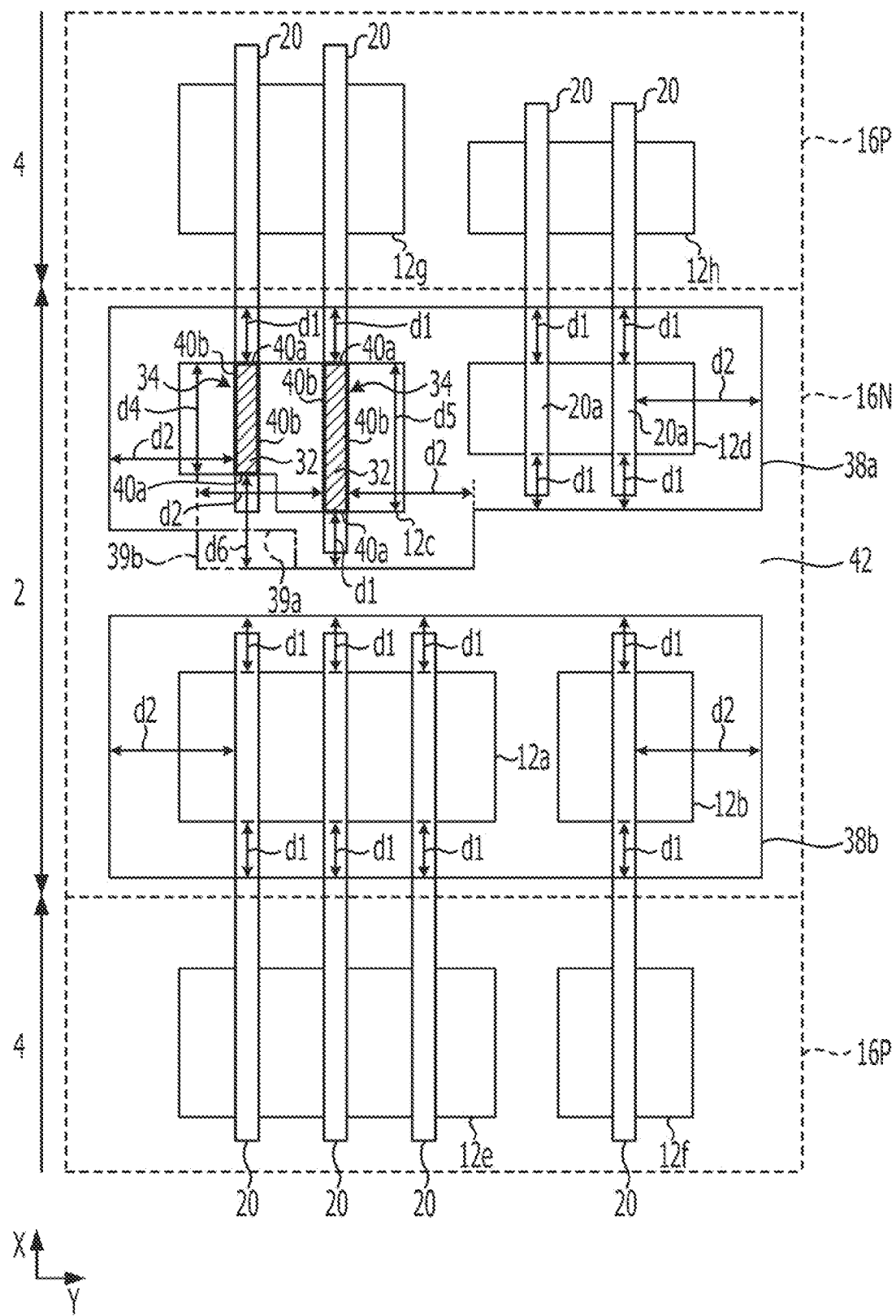
FIG. 19 is a plan view illustrating a semiconductor device according to a reference example.

First, the semiconductor device according to this embodiment will be described with reference to FIGS. 18 and 19. FIG. 18 is a plan view illustrating the semiconductor device according to this embodiment. FIG. 19 is a plan view illustrating a semiconductor device according to a reference example.

As illustrated in FIG. 18, in this embodiment, the width of the element region 12c in the longitudinal direction of the gate wires 20 is not uniform. That is, as illustrated in FIG. 18, a part of the active regions 12c has a width d4, and another part thereof has a width d5.

When the active region 12c has the shape as described above, as illustrated in FIG. 19, outer end positions 39a of the compressive stress film 38a obtained based on the positions of the end portions 40a of the regions 32 are different from each other. In the case described above, when the patterns of the compressive stress films 38a and 38b are produced by the designing method according to the first embodiment, the distances in the X direction from the end portions 40a of the regions 32 to the outer ends of the compressive stress film 38a may not always be set to the first value d1 in some cases. When the distances in the X direction from the end portions 40a of the regions 32 to the outer ends of the compressive stress film 38a are not always set to the first value d1 in some cases, the variation in ON-current between the PMOS transistors 34 may occur.

Hence, in this embodiment, by using the method for designing a semiconductor device according to this embodiment which will be described later, the distances in the X direction from the regions 32 to the boundaries between the compressive stress films 38a and 38b and the tensile stress film 42 are all set equal to each other, that is, are all set to the first value d1.

According to this embodiment, even in the case in which the widths d4 and d5 of the active region 12c in the X direction are different from each other, the distances in the X direction from the end portions 40a of the regions 32 to the boundaries between the compressive stress film 38a and the tensile stress film 42 are all set to the first value d1. Hence, according to this embodiment, even in the case in which the widths d4 and d5 of the active region 12c are different from each other, the ON-currents of the PMOS transistors 34 may be increased while the variation in ON-current thereof is substantially suppressed.

(Method for Designing Semiconductor Device)

Figure 20:
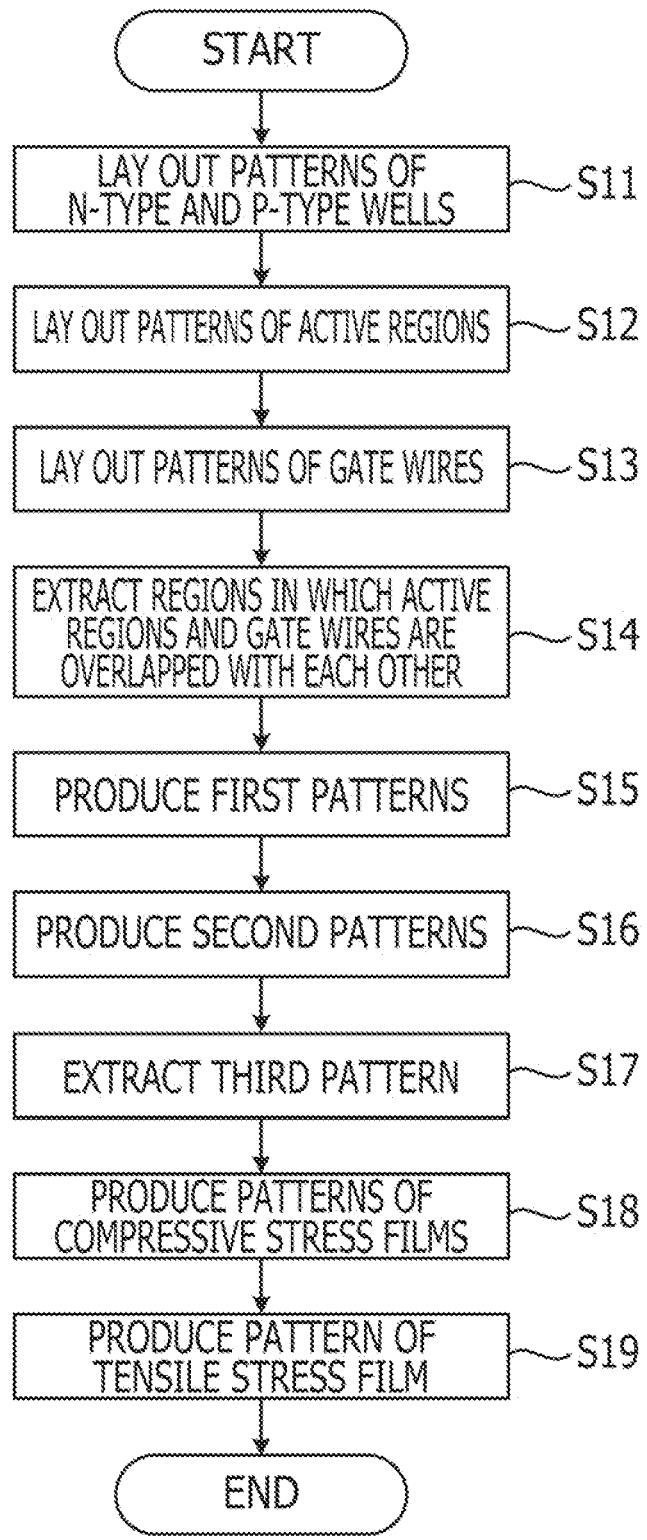
FIG. 20 is a flowchart illustrating a method for designing a semiconductor device according to the second embodiment.

Next, the method for designing a semiconductor device according to this embodiment will be described with reference to FIGS. 20 to 27. FIG. 20 is a flowchart illustrating the method for designing a semiconductor device according to this embodiment. FIGS. 21 to 27 are plan views illustrating the method for designing a semiconductor device according to this embodiment.

First, as in the case of the method for designing a semiconductor device described with reference to FIGS. 5 and 20, the pattern of the N-type well 16N and the patterns of the P-type wells 16P, which are formed in the semiconductor substrate 10, are laid out (Operation S11).

Figure 21:
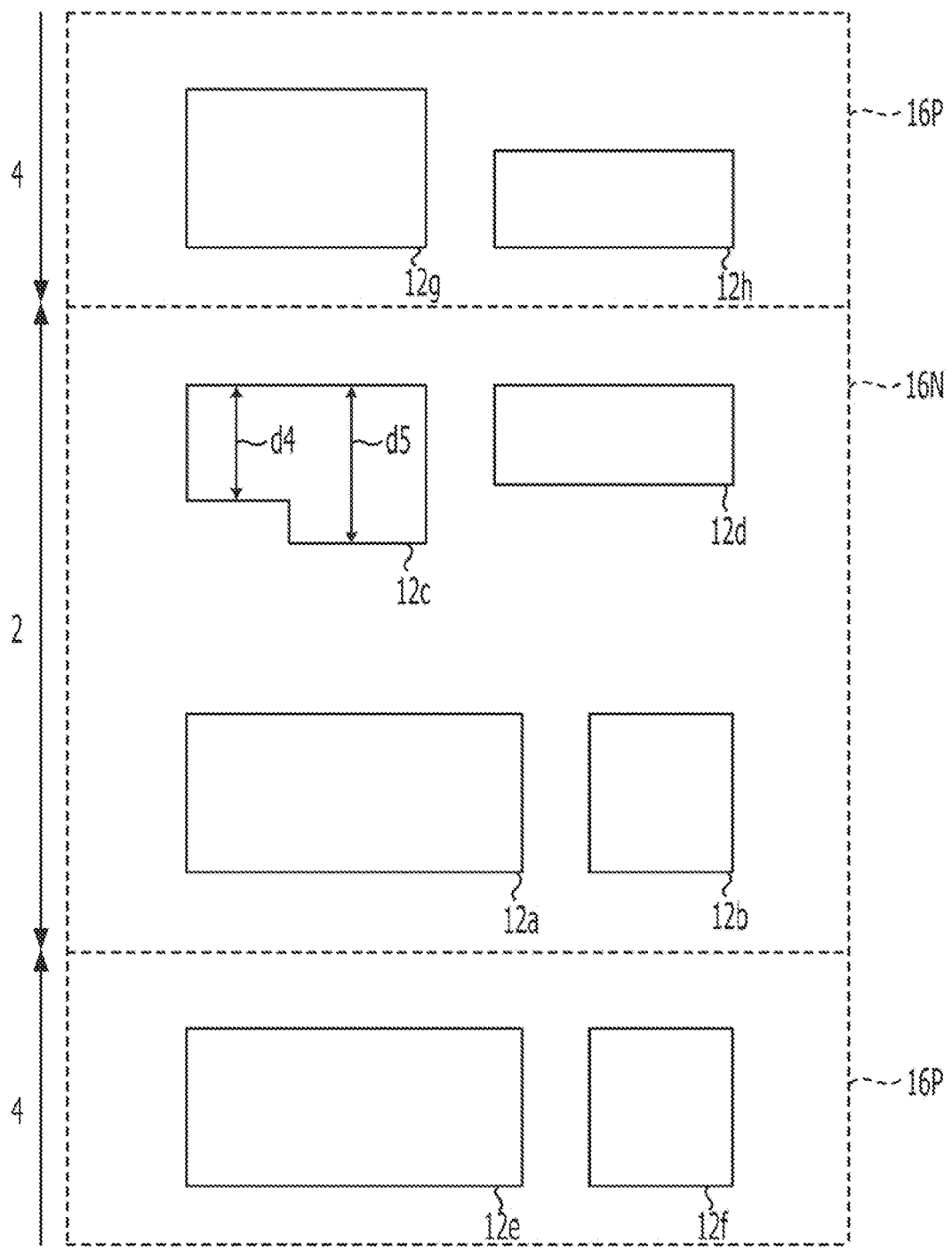
FIG. 21 is a plan view (part 1) illustrating the method for designing a semiconductor device according to the second embodiment.

Next, as illustrated in FIGS. 20 and 21, the patterns of the active regions 12a to 12h (element regions) are laid out (Operation S12). The active regions 12a to 12d are arranged in the region 2 in which PMOS transistors are formed. The active regions 12e to 12h are arranged in the regions 4 in which NMOS transistors are formed. The width of the pattern of the active region 12c in the longitudinal direction (X direction) of the gate wires 20 is not uniform. That is, a part of the active regions 12c has the width d4, and the other part thereof has the width d5.

Figure 22:
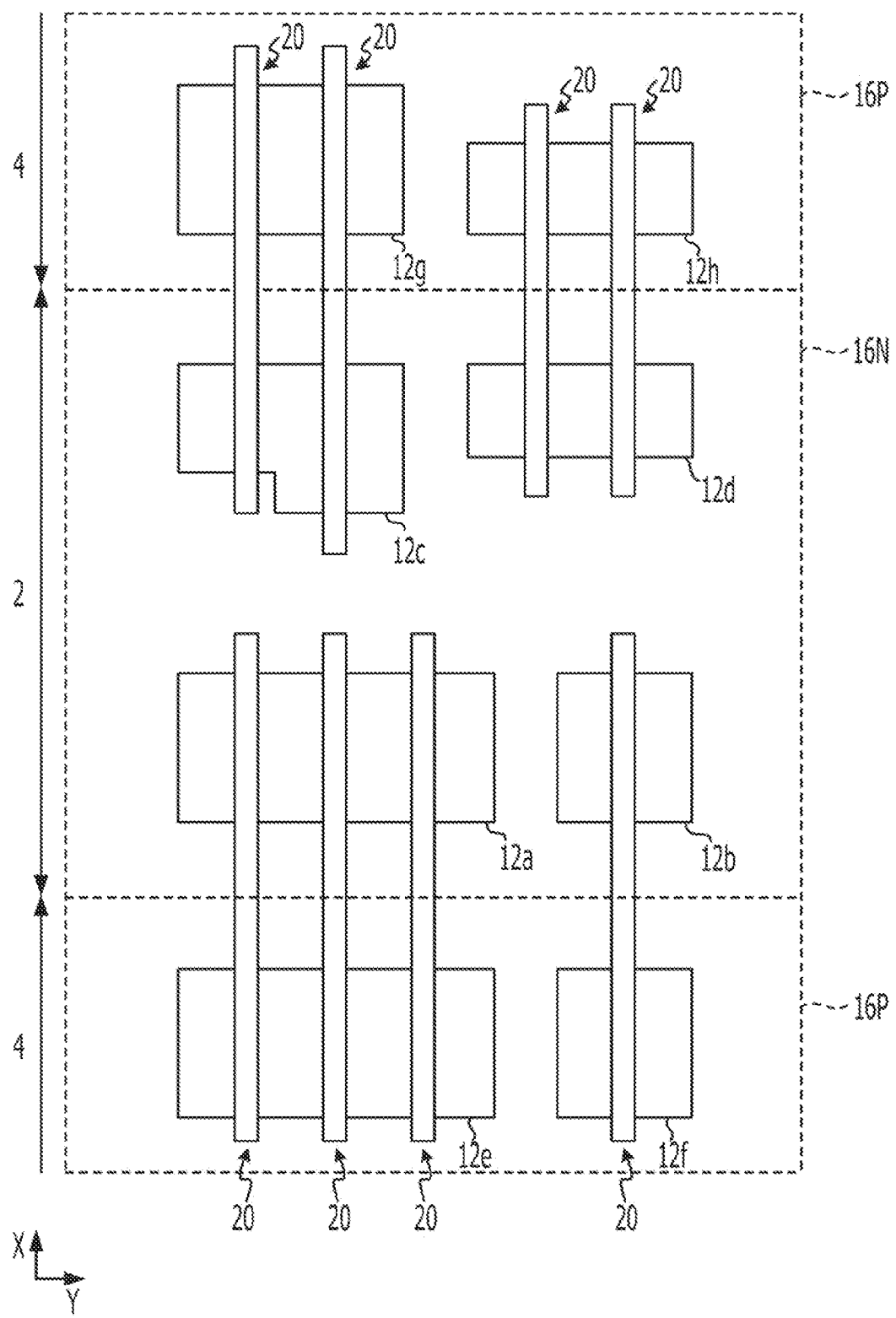
FIG. 22 is a plan view (part 2) illustrating the method for designing a semiconductor device according to the second embodiment.

Next, as illustrated in FIGS. 20 and 22, the patterns of the gate wires 20 are laid out (Operation S13). The gate wires 20 are arranged so as to intersect the active regions 12a to 12h.

Figure 23:
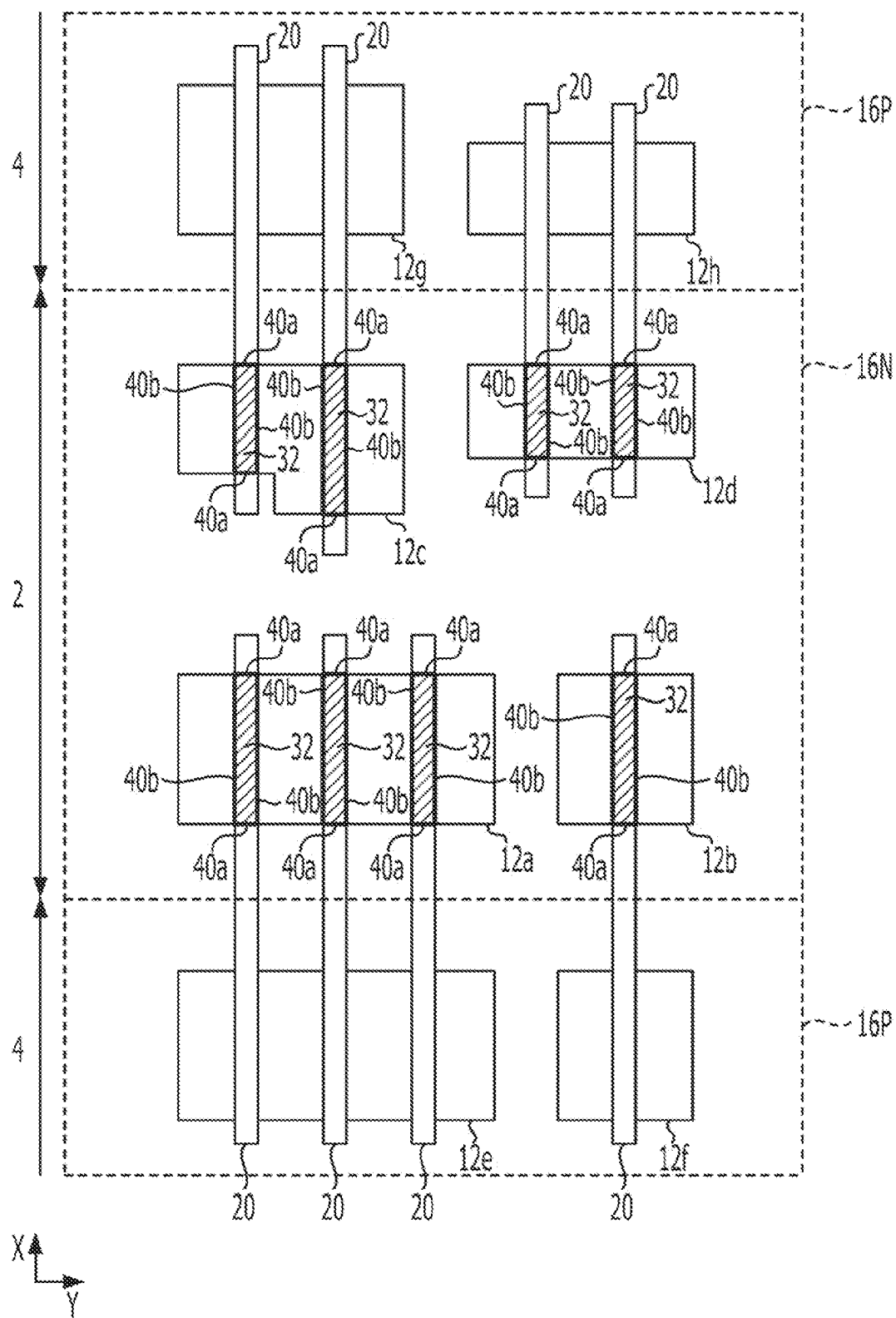
FIG. 23 is a plan view (part 3) illustrating the method for designing a semiconductor device according to the second embodiment.

Next, as illustrated in FIGS. 20 and 23, in the region 2 in which the PMOS transistors are formed, the regions 32 in which the active regions 12a to 12d and the gate wires 20 are overlapped with each other are extracted (Operation S14). Next, the positions of the end portions 40a and 40b of the regions 32 are obtained. The end portions 40a are end portions of the active regions 12a to 12d which are located directly under the gate wires 20. The end portions 40b are side portions of the gate wires 20 which are located on the active regions 12a to 12d.

Figure 24:
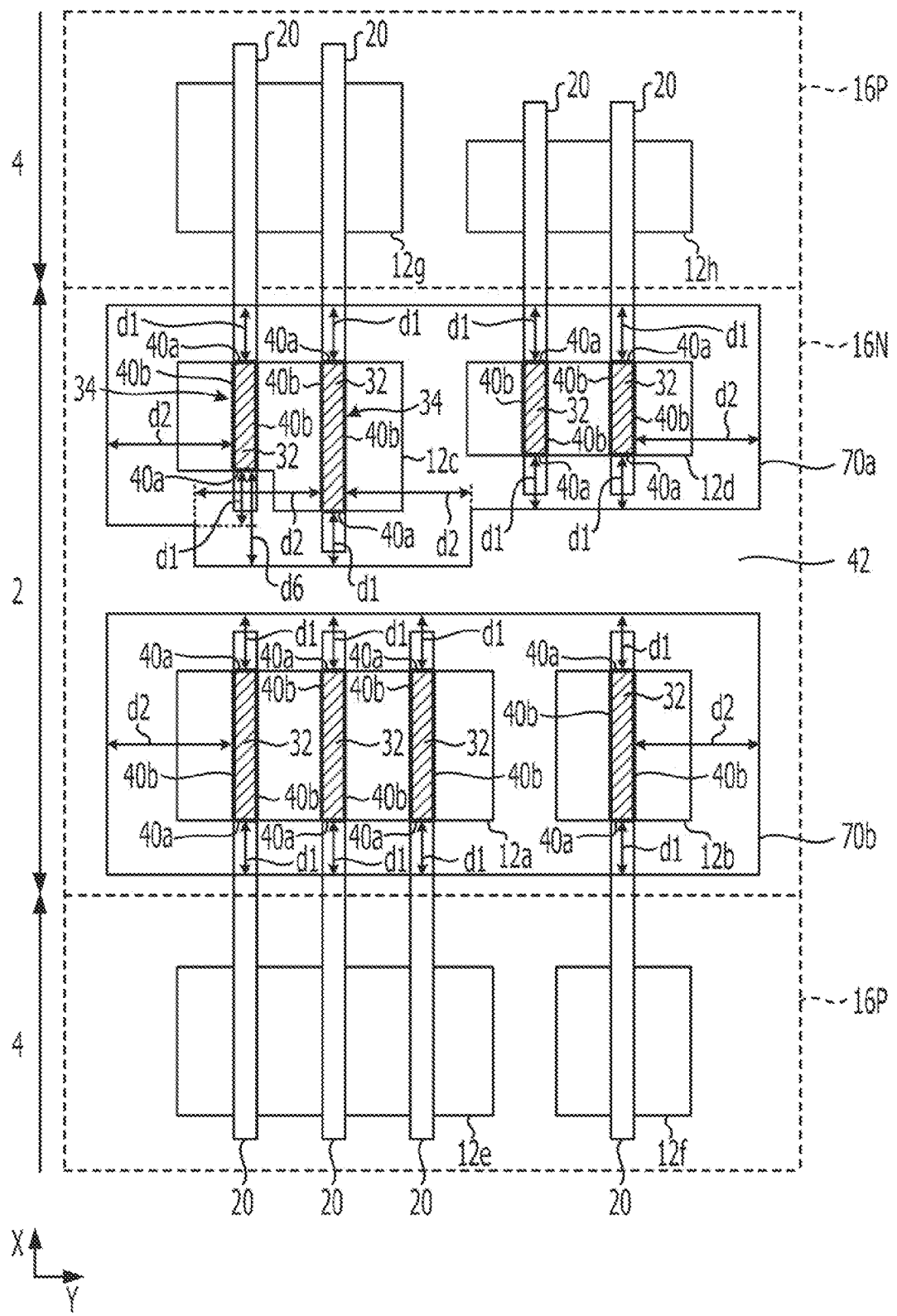
FIG. 24 is a plan view (part 4) illustrating the method for designing a semiconductor device according to the second embodiment.

Next, as illustrated in FIGS. 20 and 24, first patterns 70a and 70b are produced (Operation S15). The first pattern 70a is arranged on a region including the active regions 12c and 12d. The first pattern 70b is arranged on a region including the active regions 12a and 12b.

The first pattern regions 70a and 70b are obtained so that the regions 32 in which the gate wires 20 and the active regions 12a to 12d are overlapped with each other are extended by the first value d1 in the X direction and are extended by the second value d2 in the Y direction, and regions which are partially overlapped with each other by the extensions are merged together.

Since the regions 32 are extended by the first value d1 in the longitudinal direction (X direction) of the gate wires 20, the distances in the X direction from the end portions 40a of the regions 32 to outer ends of the first patterns 70a and 70b are all set to the first value d1. Since the regions 32 are extended by the first value d1 in the X direction, the distances in the X direction from the end portions of the active regions 12a to 12d to the outer ends of the first patterns 70a and 70b are all set to the first value d1.

Since the regions 32 are extended by the second value d2 in the direction (Y direction) perpendicular to the longitudinal direction of the gate wires 20, the distances in the Y direction from the end portions 40b of the regions 32 to the outer ends of the first patterns 70a and 70b are all set to the second value d2.

Since the first patterns 70a and 70b are obtained as described above, as illustrated in FIG. 24, some of the distances in the X direction from the end portions 40a of the regions 32 to the outer ends of the first patterns 70a and 70b may be set to a value d6, which is larger than the first value d1, in some cases.

Figure 25:
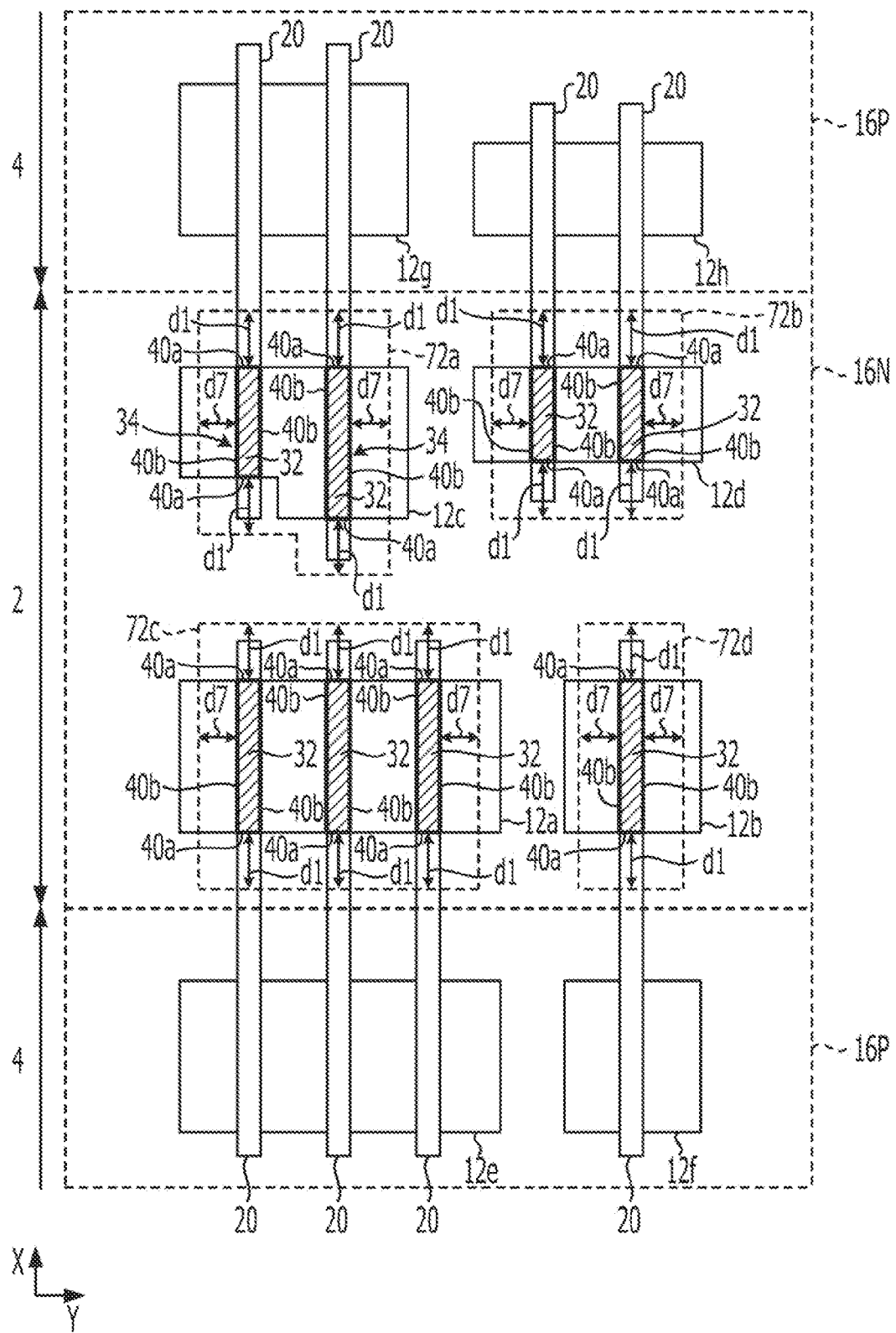
FIG. 25 is a plan view (part 5) illustrating the method for designing a semiconductor device according to the second embodiment.

Next, as illustrated in FIGS. 20 and 25, second patterns 72a to 72d are produced (Operation S16). The second pattern 72a is formed on a region including the active region 12c. The second pattern 72b is arranged on a region including the active region 12d. The second pattern 72c is formed on a region including the active region 12a. The second pattern 72d is arranged on a region including the active region 12b.

The second patterns 72a to 72d are obtained so that the regions 32 in which the gate wires 20 and the active regions 12a to 12d are overlapped with each other are extended by the first value d1 in the X direction and are extended by a seventh value d7 in the Y direction, and regions which are partially overlapped with each other by the extensions are merged together.

As described later, the second patterns 72a to 72d are used when a third pattern 74 is extracted. Hence, the seventh value d7 is set smaller than the space between the gate wires 20, for example. In this embodiment, the seventh value d7 is set, for example, to approximately a half of the pitch of the gate wires 20. In more particular, the seventh value d7 is set, for example, to approximately 0.05 to 0.2 µm.

Since the regions 32 are extended in the longitudinal direction (X direction) of the gate wires 20 by the first value d1, the distances in the X direction from the end portions 40a of the regions 32 to the outer ends of the second patterns 72a to 72d are all set to the first value d1.

Since the regions 32 are extended in the direction (Y direction) perpendicular to the longitudinal direction of the gate wires 20 by the seventh value d7, the distances in the Y direction from the end portions 40b of the regions 32 to the outer ends of the second patterns 72a to 72d are all set to the seventh value d7.

Since the second patterns 72a to 72d are obtained as described above, as illustrated in FIG. 25, the distances in the X direction from the end portions 40a of the regions 32 to the outer ends of the second patterns 72a to 72d are all set to the first value d1.

Figure 26:
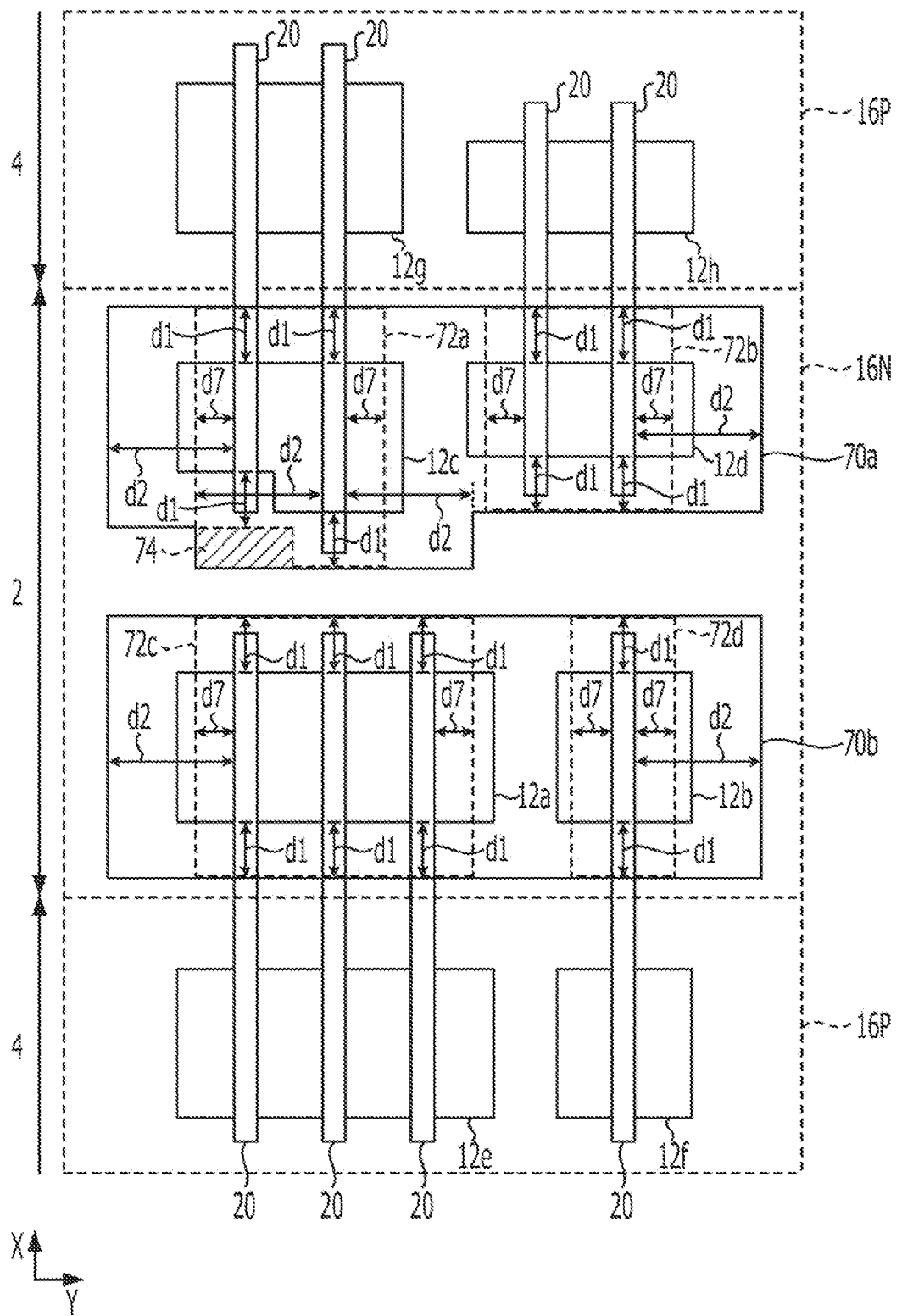
FIG. 26 is a plan view (part 6) illustrating the method for designing a semiconductor device according to the second embodiment.

Next, as illustrated in FIGS. 20 and 26, the first patterns 70a and 70b and the second pattern 72a to 72d are compared to each other, and the third pattern 74 is extracted (Operation S17). The third pattern 74 is a part of the first pattern 70a extended in the X direction from the end portion of the second pattern 72a.

Figure 27:
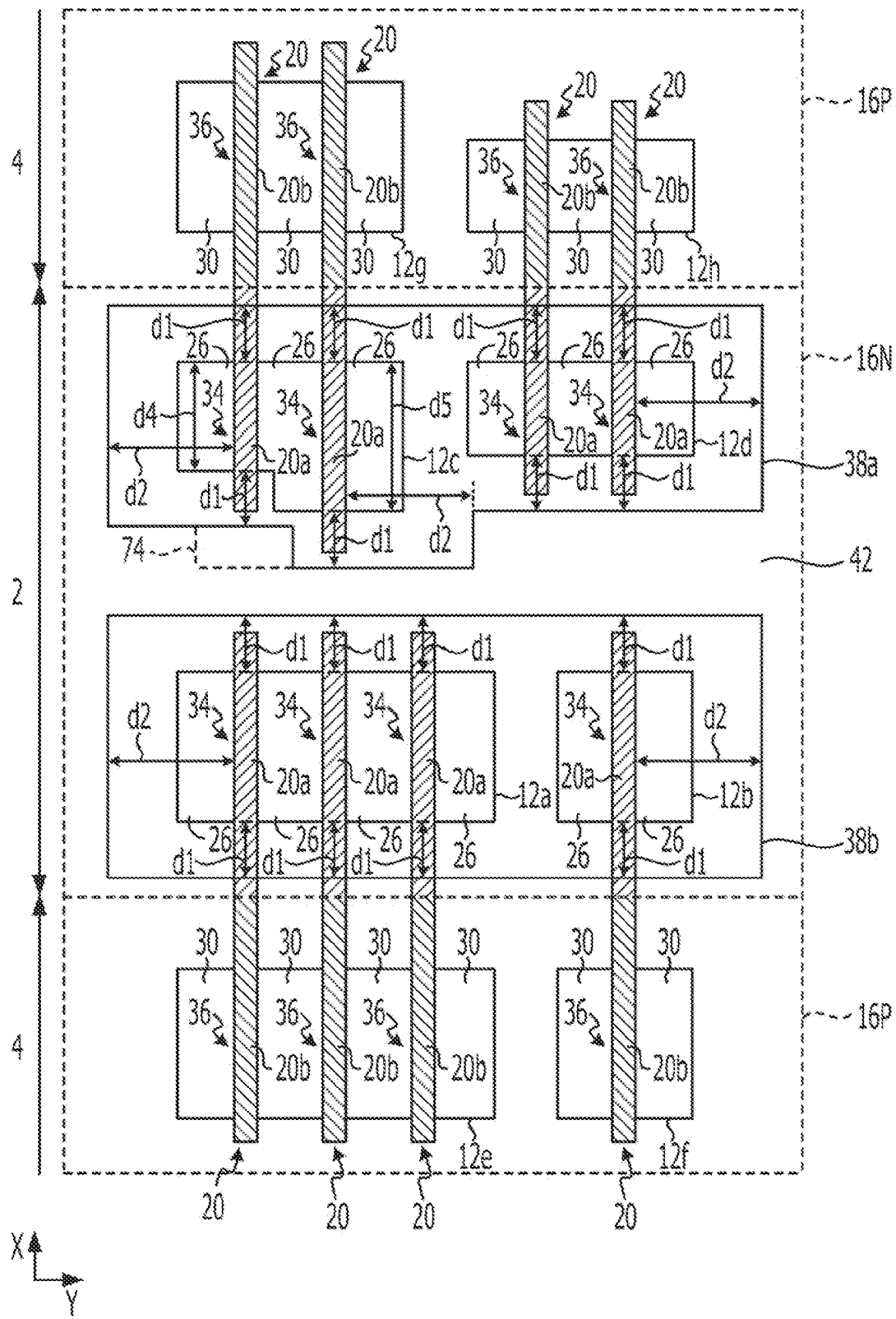
FIG. 27 is a plan view (part 7) illustrating the method for designing a semiconductor device according to the second embodiment.

Next, as illustrated in FIGS. 20 and 27, the patterns of the compressive stress films 38a and 38b are produced by removing the third pattern 74 from the first patterns 70a and 70b (Operation S18). Since the patterns of the compressive stress films 38a and 38b are obtained as described above, as illustrated in FIG. 27, the distances in the X direction from the end portions 40a of the regions 32 to the outer ends of the second patterns 72a to 72d are all set substantially equal to the first value d1.

Next, the pattern of the tensile stress film 42 is produced (Operation S19). The pattern of the tensile stress film 42 is arranged in the region other than the regions in which the compressive stress films 38a and 38b are formed. The positions of the inner ends of the pattern of the tensile stress film 42 are set so as to coincide with the positions of the outer ends of the patterns of the compressive stress films 38a and 38b.

Next, the patterns of the contact holes 46, the patterns of the wires 58, and the like are appropriately set.

Accordingly, the semiconductor device according to this embodiment is designed.

The design patterns thus formed are used when the semiconductor device according to this embodiment is manufactured.

Since the method for manufacturing a semiconductor device according to this embodiment is substantially the same as the method for manufacturing a semiconductor device according to the first embodiment, a description thereof will be omitted.

According to this embodiment, as described above, even in the case in which the width of at least one of the active regions 12a to 12d in the X direction is not uniform, the distances in the X direction from the end portions 40a of the regions 32 to the boundaries between the compressive stress film 38a and the tensile stress film 42 are all set to the first value d1. Accordingly, in this embodiment, even in the case in which the width of at least one of the active regions 12a to 12d in the X direction is not uniform, while the variation in ON-current of the PMOS transistors is substantially suppressed, the ON-currents thereof may be improved. Hence, according to this embodiment, a semiconductor device having excellent electrical properties may be provided.

[Modified Embodiment]

Besides the above embodiments, various modifications may also be performed.

For example, although a silicon nitride film is formed as the compressive stress films 38a and 38b in the above embodiments, the compressive stress films 38a and 38b are not limited to a silicon nitride film. Any film capable of applying a compressive stress to the channel regions of the transistors formed in the region 2 may be appropriately formed.

In addition, although a silicon nitride film is formed as the tensile stress film 42 in the above embodiments, the tensile stress film 42 is not limited to a silicon nitride film. Any film capable of applying a tensile stress to the channel regions of the transistors formed in the regions 4 may be appropriately formed.

In addition, although the case in which after the solid tensile stress film 42 is patterned, the compressive stress film 38 is formed on the entire surface and is then patterned is described by way of example, the process is not limited to the case described above. For example, after the compressive stress film 38 is patterned, the solid tensile stress film 42 may be formed on the entire surface and then patterned.

According to the embodiments described above, the positions of the end portions of the compressive stress films are determined based on the positions of the end portions of the regions in which the active regions and the gate wires are overlapped with each other. Hence, the distances from the regions in which the active regions and the gate wires are overlapped with each other to the boundaries between the compressive stress films and the tensile stress film are all set substantially equal to each other. Accordingly, even in a semiconductor device including many PMOS transistors, while the variation in ON-current of the PMOS transistors is substantially suppressed, the ON-currents thereof may be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor device comprising:
   first active regions provided in a semiconductor substrate;
   second active regions provided in the semiconductor substrate;
   gate wires which intersect the first active regions and the second active regions;
   first transistors which are provided on the first active regions and which include first gate electrodes, each of which is a part of each gate wire;
   second transistors which are provided on the second active regions and which include second gate electrodes, each of which is a part of each gate wire;
   at least one compressive stress film which is provided on a region including the first active regions and which covers the first transistors; and
   a tensile stress film which is provided on a region including the second active regions adjacent to the compressive stress film and which covers the second transistors,
   wherein the distances in a longitudinal direction of the gate wires from end portions of first regions in which the first active regions and the gate wires are overlapped with each other to end portions of the at least one compressive stress film are set to a first value,
   wherein the at least one compressive stress film is surrounded by the tensile stress film,
   wherein the at least one compressive stress film includes a projective portion at a portion where the at least one compressive stress film is contact with the tensile stress film.

2. The semiconductor device according to claim 1, wherein a space between one first active region and another first active region adjacent thereto in the longitudinal direction of the gate wires is set two or more times the first value, one compressive stress film is arranged on a region including the one first active region, another compressive stress film is arranged on a region including the another first active region, and the tensile stress film is provided between the one compressive stress film and the another compressive stress film.

3. The semiconductor device according to claim 1, wherein the projective portion projects from an upper surface of the tensile stress film.

4. A semiconductor device comprising:
   first active regions provided in a semiconductor substrate;
   second active regions provided in the semiconductor substrate;
   gate wires which intersect the first active regions and the second active regions;
   first transistors which are provided on the first active regions and which include first gate electrodes, each of which is a part of each gate wire;
   second transistors which are provided on the second active regions and which include second gate electrodes, each of which is a part of each gate wire;
   at least one compressive stress film which is provided on a region including the first active regions and which covers the first transistors; and
   a tensile stress film which is provided on a region including the second active regions adjacent to the compressive stress film and which covers the second transistors,
   wherein the distances in a longitudinal direction of the gate wires from end portions of first regions in which the first active regions and the gate wires are overlapped with each other to end portions of the at least one compressive stress film are set to a first value,
   wherein a space between one first active region and another first active region adjacent thereto in the longitudinal direction of the gate wires is set two or more times the first value, one compressive stress film is arranged on a region including the one first active region, another compressive stress film is arranged on a region including the another first active region, and the tensile stress film is provided between the one compressive stress film and the another compressive stress film.

5. The semiconductor device according to claim 4, wherein the at least one compressive stress film includes a projective portion at a portion where the at least one compressive stress film is contact with the tensile stress film.

6. The semiconductor device according to claim 5, wherein the projective portion projects from an upper surface of the tensile stress film.

* * * * *